US011037954B2

(12) United States Patent
Song

(10) Patent No.: US 11,037,954 B2
(45) Date of Patent: Jun. 15, 2021

(54) THREE DIMENSIONAL FLASH MEMORY ELEMENT WITH MIDDLE SOURCE-DRAIN LINE AND MANUFACTURING METHOD THEREOF

(71) Applicant: Samsung Electronics Co., Ltd., Suwon-si (KR)

(72) Inventor: Yun Heub Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/476,954

(22) PCT Filed: Apr. 13, 2018

(86) PCT No.: PCT/KR2018/004323
§ 371 (c)(1),
(2) Date: Jul. 10, 2019

(87) PCT Pub. No.: WO2019/074177
PCT Pub. Date: Apr. 18, 2019

(65) Prior Publication Data
US 2019/0355743 A1 Nov. 21, 2019

(30) Foreign Application Priority Data

Oct. 11, 2017 (KR) .................. 10-2017-0130258
Apr. 13, 2018 (KR) .................. 10-2018-0043070

(51) Int. Cl.
*G11C 11/34* (2006.01)
*H01L 27/11582* (2017.01)
(Continued)

(52) U.S. Cl.
CPC .... *H01L 27/11582* (2013.01); *G11C 16/0483* (2013.01); *G11C 16/10* (2013.01);
(Continued)

(58) Field of Classification Search
CPC ...... G11C 16/0483; G11C 16/10; G11C 16/14; G11C 16/26; H01L 27/11582;
(Continued)

(56) References Cited

U.S. PATENT DOCUMENTS 8,735,247 B2 * 5/2014 Yoo .................. H01L 27/11578
438/268
9,997,462 B2 * 6/2018 Ha ........................ H01L 23/535
(Continued)

FOREIGN PATENT DOCUMENTS

JP 2010114204 A 5/2010
KR 1020110029403 A 3/2011
(Continued)

*Primary Examiner* — Viet Q Nguyen
(74) *Attorney, Agent, or Firm* — Harness, Dickey & Pierce, P.L.C.

(57) ABSTRACT

A three dimensional flash memory element with middle source-drain line and manufacturing method thereof. The three dimensional flash memory element includes a string including a channel layer extended in one direction and a plurality of electrode layers vertically layered for the channel layer; an upper wiring layer placed at the top of the string; at least one intermediate wiring layer placed between the plurality of electrode layers in the intermediate area of the string; and a lower wiring layer placed at the bottom of the string. Each of the upper wiring layer, the at least one intermediate wiring layer, and the lower wiring layer is adaptively used as any one of a drain electrode or a source electrode.

21 Claims, 30 Drawing Sheets

(51) Int. Cl.

| | |
|---|---|
| *G11C 16/04* | (2006.01) |
| *G11C 16/10* | (2006.01) |
| *G11C 16/14* | (2006.01) |
| *G11C 16/26* | (2006.01) |
| *H01L 21/311* | (2006.01) |
| *H01L 21/321* | (2006.01) |
| *H01L 21/3213* | (2006.01) |
| *H01L 21/3215* | (2006.01) |
| *H01L 21/768* | (2006.01) |
| *H01L 23/528* | (2006.01) |

(52) U.S. Cl.
CPC .............. *G11C 16/14* (2013.01); *G11C 16/26* (2013.01); *H01L 21/31111* (2013.01); *H01L 21/31144* (2013.01); *H01L 21/3212* (2013.01); *H01L 21/3215* (2013.01); *H01L 21/32133* (2013.01); *H01L 21/7684* (2013.01); *H01L 21/76802* (2013.01); *H01L 21/76877* (2013.01); *H01L 21/76886* (2013.01); *H01L 23/528* (2013.01)

(58) Field of Classification Search
CPC ......... H01L 21/31111; H01L 21/31144; H01L 21/3212; H01L 21/32133; H01L 21/3215; H01L 21/76802; H01L 21/7684; H01L 21/76877; H01L 21/76886; H01L 23/528
USPC .............................................. 365/185.33, 63
See application file for complete search history.

(56) References Cited

U.S. PATENT DOCUMENTS

| | | | | |
|---|---|---|---|---|
| 10,204,692 | B1* | 2/2019 | Kamata | G11C 16/0475 |
| 10,403,640 | B2* | 9/2019 | Hwang | H01L 27/11575 |
| 10,411,034 | B2* | 9/2019 | Jang | H01L 21/3115 |
| 10,529,727 | B2* | 1/2020 | Park | H01L 27/11565 |
| 10,553,605 | B2* | 2/2020 | Gu | H01L 27/11548 |
| 10,559,583 | B2* | 2/2020 | Park | H01L 27/1157 |
| 10,559,584 | B2* | 2/2020 | Choi | H01L 27/1157 |
| 10,566,345 | B2* | 2/2020 | Kanamori | H01L 27/11575 |
| 10,614,889 | B2* | 4/2020 | Ko | G11C 16/0483 |
| 10,629,609 | B2* | 4/2020 | Lee | H01L 27/11565 |
| 10,685,980 | B2* | 6/2020 | Kim | H01L 27/11582 |
| 2012/0007192 | A1* | 1/2012 | Kato | H01L 27/11519 257/401 |
| 2013/0237051 | A1* | 9/2013 | Kikutani | H01L 27/11524 438/622 |
| 2019/0221267 | A1* | 7/2019 | Ko | H01L 27/1157 |
| 2020/0286914 | A1* | 9/2020 | Song | H01L 27/11573 |

FOREIGN PATENT DOCUMENTS

| | | |
|---|---|---|
| KR | 1020110082328 A | 7/2011 |
| KR | 1020140088384 A | 7/2014 |
| KR | 20160095557 A | 8/2016 |
| KR | 1020170036548 A | 4/2017 |

* cited by examiner

THREE DIMENSIONAL FLASH MEMORY ELEMENT WITH MIDDLE SOURCE-DRAIN LINE AND MANUFACTURING METHOD THEREOF

This is a national stage application filed under 35 U.S.C. § 371 of pending international application PCT/KR2018/004323 filed Apr. 13, 2018, which claims priority to Korean Patent application 10-2017-0130258, filed Oct. 11, 2017, and Korean Patent application 10-2018-00430709, filed Apr. 13, 2018, the entirety of which applications are hereby incorporated by reference herein.

TECHNICAL FIELD

The following example embodiments relate to a three dimensional flash memory and manufacturing method thereof, more particularly, a three dimensional flash memory including at least one intermediate wiring layer for each string.

BACKGROUND ART

A flash memory element is as an EEPROM (Electrically Erasable Programmable Read Only Memory), and the memory may be commonly used, for example, in a computer, a digital camera, an MP3 player, a game system, a memory stick, and the like. This flash memory element electrically controls data input and output by F-N tunneling (Fowler-Nordheimtunneling) or Hot Electron injection.

Particularly, referring to FIG. 1 representing an array of an existing three dimensional flash memory, the array of the three dimensional flash memory may include a CSL (Common Source Line), a BL (Bit Line), and a plurality of CSTRs (cell string) placed between the CSL and the BL.

BLs are two-dimensionally arranged, and in each of them, a plurality of CSTRs is arranged in parallel. The CSTRs may be connected to the CSL in common. In other words, the plurality of CSTRs may be placed between a plurality of BLs and one CSL. At this point, the CSL may be multiple, and a plurality of CSLs may be arranged in two-dimension. Here, electrically same voltage may be applied to the plurality of CSLs, or each of the plurality of CSLs may be electrically controlled.

Each of CSTRs may be configured with a GST (Ground Selection Transistor) connected to the CSL, a SST (String Selection Transistor) connected to the BL, and a plurality of MCTs (Memory Cell Transistor) placed between the GST and SST. Also, the GST, SST, and MCT may be connected in parallel.

The CSL may be commonly connected to sources of GSTs. Furthermore, the GSL, a plurality of word lines WL0-WL3, and a plurality of SSLs placed between the CSL and the BL may be respectively used as electrode layers of the GST, the MCT, and the SST. Also, each of MCTs includes a memory element.

Meanwhile, the existing three dimensional flash memory increases integration density by vertically layering cell in order to satisfy excellent performance and low price which customers demand.

For example, referring to FIG. 2 representing a structure of an existing three dimensional flash memory, the existing three dimensional flash memory places an electrode structure 215 where interlayer insulating layers 211 and horizontal structures 250 are alternately and repeatedly formed on a substrate 200 and is manufactured. The interlayer insulating layers 211 and the horizontal structures 250 may be extended in a first direction. The interlayer insulating layers 211 may be, for example, silicon oxide film, and the lowest interlayer insulating layer 211a among the interlayer insulating layers 211 may have a thickness thinner than the rest interlayer insulating layers 211. Each of the horizontal structures may include first and second insulating films 242, 243 and an electrode layer 245. The electrode structures 215 are provided in plural, and the plurality of electrode structures 215 may be placed facing each other in a second direction intersecting with a first direction. Each of the first and second direction may be correspond to x-axis and y-axis of FIG. 2. Between the plurality of electrode structures 215, trenches 240 separating them may be extended in the first direction. High concentration doped impurities areas may be formed in the substrate 200 exposed by the trenches 240 and the CSL may be placed. Although it is not illustrated, isolation insulating film filling the trenches 240 may be further placed.

Vertical structures 230 penetrating the electrode structures 215 may be placed. For example, the vertical structures 230 may be arranged along the first and second direction and placed in a matrix form in a planar viewpoint. As another example, the vertical structures 230 may be arranged in the second direction, but placed in the first direction in a zigzag form. Each of the vertical structures 230 may include a protective film 224, a charge storage film 225, a tunnel insulating film 226, and a channel layer 227. For example, the channel layer 227 may be placed in a form of tube where inside is hollow, and in this case, a filling film 228 filling the inside of the channel layer 227 may be further placed. Drain area D is placed at the top of the channel layer 227, and a conductive pattern is formed on the drain area D and may be connected with a BL. The BL may be extended in a direction intersecting with the horizontal electrodes 250, for example, in the second direction. For example, the vertical structures 230 arranged in the second direction may be connected with one BL.

The first and second blocking insulating films 242, 243 included in the horizontal structures 250 and the charge storage film 225 and the tunnel insulating film 226 included in the vertical structures 230 may be defined as ONO (Oxide-Nitride-Oxide) layer which is information storage element of the three dimensional flash memory. In other words, some of information storage elements may be included in the vertical structures 230, and some of the rest may be included in the horizontal structures 250. For example, the charge storage film 225 and the tunnel insulating film 226 among the information storage elements may be included in the vertical structures 230, and the first and second blocking insulating films 242, 243 may be included in the horizontal structures 250.

Epitaxial patterns 222 may be placed between a substrate 200 and the vertical structures 230. The epitaxial patterns 222 connect the substrate 200 and the vertical structures 230. The epitaxial patterns 222 may contact at least one layer of the horizontal structures 250. In other words, the epitaxial patterns 222 may be placed to contact with the lowest horizontal structure 250a. According to another example of embodiments, the epitaxial patterns 222 may be placed to contact with a plurality of layers, for example, two layers of the horizontal structures 250. Meanwhile, in case that the epitaxial patterns 222 are placed to contact with the lowest horizontal structure 250a, the lowest horizontal structure 250a may be placed thicker than the rest horizontal structures 250. The lowest horizontal structure 250a contacting to the epitaxial patterns 222 may correspond to the GSL of an array of the three dimensional flash memory described with referring to FIG. 1, and the rest horizontal structures 250 contacting to the vertical structures 230 may correspond to the plurality of word lines WL0-WL3.

Each of the epitaxial patterns 222 has a recessed side wall 222a. Accordingly, the lowest horizontal structure 250a contacting with the epitaxial patterns 222 is placed along profile of the recessed side wall 222a. In other words, the lowest horizontal structure 250a may be placed in an inwardly convex form along the recessed side wall 222a of the epitaxial patterns 222.

For the existing three dimensional flash memory having this structure, as the number of vertically layered layers is increased, the length of the channel layer 227 is increased, and this causes cell current decrease and cell degradation.

Accordingly, the following example embodiments propose a technology for increasing cell current which is decreased as the length of the channel layer is increased in the three dimensional flash memory, and improving cell degradation according to the cell current decrease.

DETAILED DESCRIPTION OF THE INVENTION

Technical Problem

Example embodiments of the present invention propose a three dimensional flash memory solving disadvantages of cell current decrease and cell degradation that an existing three dimensional flash memory has by including at least one intermediate wiring layer which is formed to be reconfigurable to be adaptively used as any one of a source electrode or a drain electrode and a manufacturing method thereof.

Particularly, example embodiments of the present invention propose a three dimensional flash memory where each of an upper wiring layer, a lower wiring layer, and at least one intermediate wiring layer located between the upper wiring layer and the lower wiring layer is formed to be reconfigurable to be adaptively used as any one of a source electrode or a drain electrode and a manufacturing method thereof.

Technical Solution

According to an example of embodiments of the present invention, a three dimensional flash memory element includes a string including a channel layer extended in one direction and a plurality of electrode layers vertically layered for the channel layer; an upper wiring layer placed at the top of the string; at least one intermediate wiring layer placed between the plurality of electrode layers in the intermediate area of the string; and a lower wiring layer placed at the bottom of the string; and each of the upper wiring layer, the at least one intermediate wiring layer, and the lower wiring layer may be adaptively used as any one of a drain electrode or a source electrode.

According to an aspect of an example of embodiments of the present invention, each of the upper wiring layer, the at least one intermediate wiring layer, and the lower wiring layer is extended in a direction orthogonal to the direction where the plurality of electrode layers is extended.

According to another aspect of an example of embodiments of the present invention, the upper wiring layer, the at least one intermediate wiring layer, and the lower wiring layer are formed in a stepped form in order that the extended lengths are different from each other.

According to another example of embodiments of the present invention, a three dimensional flash memory element includes a string including a channel layer extended in one direction and a plurality of electrode layers vertically layered for the channel layer; an upper wiring layer placed at the top of the string; at least one intermediate wiring layer placed between the plurality of electrode layers in intermediate area of the string; and a lower wiring layer placed at the bottom of the string; and each of the upper wiring layer, the at least one intermediate layer, and the lower wiring layer is extended in a direction orthogonal to the direction where the plurality of electrode layers is extended, and the upper wiring layer, the at least one intermediate layer, and the lower wiring layer are formed in a stepped form in order that the extended lengths are different from each other.

According to an aspect of an example of embodiments of the present invention, each of the upper wiring layer, the at least one intermediate layer, and the lower wiring layer is adaptively used as any one of a drain electrode or a source electrode.

According to another aspect of an example of embodiments of the present invention, each of the upper wiring layer, the at least one intermediate wiring layer, and the lower wiring layer is adaptively used as the rest one of the drain electrode or the source electrode except any one of them which another wiring layer is used as in response that another wiring layer placing a memory cell to control in between is used as the any one of the drain electrode or the source electrode.

According to another aspect of an example of embodiments of the present invention, when to control a memory cell located between the upper wiring layer and the at least one intermediate wiring layer, the upper wiring layer is used as randomly any one of the drain electrode or the source electrode, and the at least one intermediate wiring layer is used as the rest one of the drain electrode or the source electrode except the any one of them which the upper wiring layer is used as, and when to control a memory cell located between the at least one intermediate wiring layer and the lower wiring layer, the at least one intermediate wiring layer is used as randomly any one of the drain electrode or the source electrode, and the lower wiring layer is used as the rest one of the drain electrode or the source electrode except the any one of them which the at least one intermediate wiring layer is used as.

According to another aspect of an example of embodiments of the present invention, the upper wiring layer and the at least one intermediate wiring layer are provided to respond to each of at least two blocks where the plurality of electrode layers is grouped.

According to another aspect of an example of embodiments of the present invention, the channel layer is at least partially penetrated by the at least one intermediate wiring layer.

According to another aspect of an example of embodiments of the present invention, at least one side of the upper side or lower side of the at least one intermediate wiring layer, the lower side of the upper wiring layer, or the upper side of the lower wiring layer is doped with at least one of N+ type or N− type.

According to another aspect of an example of embodiments of the present invention, when a plurality of strings is included in the three dimensional flash memory element, the plurality of strings is connected to each other through a substrate.

According to another aspect of an example of embodiments of the present invention, when a plurality of strings is included in the three dimensional flash memory element, the lower wiring layers are shared and used in common by the plurality of strings.

According to another aspect of an example of embodiments of the present invention, the lower wiring layer is implemented as a substrate including a contact doped with N+ type on P type substrate base.

According to an example of embodiments of the present invention, a manufacturing method of three dimensional flash memory element includes preparing a plurality of mold structures in which each of strings including a plurality of electrode layers and a plurality of interlayer insulating layers alternately layered and a channel layer extended in one direction to penetrate the plurality of electrode layers and the plurality of interlayer insulating layers is formed; layering at least one rest mold structure where an intermediate wiring layer is placed at the bottom of the string among the plurality of mold structures at the top of any one mold structure where a lower wiring layer is placed at the bottom of the string among the plurality of mold structures; and forming an upper wiring layer at the top of the string on the at least one rest mold structure layered on the any one mold structure, and each of the upper wiring layer, the at least one intermediate wiring layer, and the lower wiring layer may be adaptively used as any one of a drain electrode or a source electrode.

According to an aspect of an example of embodiments of the present invention, the manufacturing method of three dimensional flash memory element may further include doping at least one side of the upper side and lower side of the at least one intermediate wiring layer, the lower side of the upper wiring layer, or the upper side of the lower wiring layer placed at the bottom of the string with at least one of N+ type or N− type.

According to another aspect of an example of embodiments of the present invention, the doping at least one side with at least one of N+ type or N− type may include doping the at least one side with at least one of N+ type or N− type by using N+ or N− ion implantation of the string and annealing process through the upper channel layer.

According to another aspect of an example of embodiments of the present invention, the preparing a plurality of mold structures may include depositing a metal layer and an N+ type doping layer in order at the top of a layer base; etching the rest area of the area of the metal layer and the N+ type doping layer except some area corresponding to an area where the channel layer of the at least one rest mold structure will be formed; forming an interlayer insulating layer at the top of the layer base where some area of the metal layer and the N+ type doping layer remains; and performing CMP (Chemical Mechanical Polishing) for the interlayer insulating layer in order that the N+ type doping layer is exposed.

According to another aspect of an example of embodiments of the present invention, the preparing a plurality of mold structures may include generating an etching space by etching some area corresponding to an area where the channel layer of the at least one rest mold structure will be formed among the area of the interlayer insulating layer layered at the top of the layer base; depositing the metal layer in the etching space in order that the etching space is filled up to a certain height; depositing the N+ type doping layer in the rest area of the interlayer insulating layer except the area where the metal layer is deposited and at the top of the metal layer; and performing CMP for the N+ type doping layer in order to remain only the area corresponding to the top of the metal layer among the N+ type doping layer.

According to another aspect of an example of embodiments of the present invention, the preparing a plurality of mold structures may include generating an etching space by etching some area corresponding to an area where a channel area of the at least one rest mold structure will be formed among the area of the interlayer insulating layer layered at the top of the layer base; depositing the metal layer in the etching space in order to fully fill up the etching space; depositing the N+ type doping layer in the area of the interlayer insulating layer and at the top of the metal layer; and placing and etching a mask at the area corresponding to the top of the metal layer among the N+ type doping layer in order to remain only the area corresponding to the top of the metal layer among the N+ type doping layer.

According to another aspect of an example of embodiments of the present invention, the layering the at least one rest mold structure where the at least one intermediate wiring layer is placed at the bottom of the string among the plurality of mold structures at the top of the at least one mold structure may be layering the at least one rest mold structure at the top of the any one mold structure in order to match the location of the string on the at least one mold structure and the location of the string on the at least one rest mold structure.

According to another aspect of an example of embodiments of the present invention, the lower wiring layer may be extended in a direction orthogonal to a direction where the plurality of electrode layers is extended on the at least one mold structure, the at least one intermediate wiring layer may be extended in a direction orthogonal to a direction where the plurality of electrode layers is extended on the at least one rest mold structure, the forming the upper wiring layer at the top of the string on the at least one rest mold structure may be extending the upper wiring layer in a direction orthogonal to a direction where the plurality of electrode layers is extended on the at least one rest mold structure, and the upper wiring layer, the at least one intermediate wiring layer, and the lower wiring layer may be formed in a stepped form in order that the extended lengths are different from each other.

According to an example of embodiments of the present invention, a program operation method of three dimensional flash memory element including a string including a channel layer extended in one direction and a plurality of electrode layers vertically layered for the channel layer; an upper wiring layer placed at the top of the string; at least one intermediate wiring layer placed between the plurality of electrode layers in intermediate area of the string; and a lower wiring layer placed at the bottom of the string may include applying 0V voltage or low voltage compared to program voltage to each of the upper wiring layer, the at least one intermediate wiring layer, and the lower wiring layer; and performing a programming operation of a memory cell by applying program voltage to word line connected to an electrode layer corresponding to the memory to control.

According to an example of embodiments of the present invention, an erase operation method of three dimensional flash memory element including a string including a channel layer extended in one direction and a plurality of electrode layers vertically layered for the channel layer; an upper wiring layer placed at the top of the string; at least one intermediate wiring layer placed between the plurality of electrode layers in intermediate area of the string, and a lower wiring layer placed at the bottom of the string may include applying erase voltage to at least one wiring layer among the upper wiring layer, the at least one wiring layer, or the lower wiring layer according to a memory cell to control; and performing an erase operation for the memory cell by applying 0V voltage or lower voltage compared to erase voltage to word line connected to an electrode layer corresponding to the memory cell.

According to an example of embodiments of the present invention, a read operation method of three dimensional flash memory element including a string including a channel layer extended in one direction and a plurality of electrode layers vertically layered for the channel layer; an upper wiring layer placed at the top of the string; at least one intermediate wiring layer placed between the plurality of electrode layers in intermediate area of the string; and a lower wiring layer placed at the bottom of the string may include selecting two wiring layers corresponding to a first block among the upper wiring layer, the at least one intermediate wiring layer, or the lower wiring layer in the first block of at least two blocks where the plurality of electrode layers is grouped; applying free charge voltage to any one wiring layer by using the any one wiring layer of the two wiring layers as a drain electrode; sensing at least one memory cell corresponding to at least one electrode layer included in the first block in order; selecting two wiring layers corresponding to a second block among the upper wiring layer, the at least one intermediate wiring layer, or the lower wiring layer in the second block of the at least two blocks; applying free charge voltage to any one wiring layer by using the any one wiring layer of the two wiring layer as a drain electrode; and sensing at least one memory cell corresponding to at least one electrode layer included in the second block in order.

According to an aspect of an example of embodiments of the present invention, the applying free charge voltage to any one wiring layer in the second block may perform simultaneously the sensing at least one memory cell corresponding to at least one electrode layer included in the first block in order when any one wiring layer where free charge voltage is applied in the second block is not the rest one wiring layer of the two wiring layers of the first block except the any one wiring layer where free charge voltage is applied in the first block.

Advantageous Effects of the Invention

Example embodiments of the present invention may propose a three dimensional flash memory including at least one intermediate wiring layer which is formed to be reconfigurable to be adaptively used as any one of a source electrode or a drain electrode and a manufacturing method thereof.

Particularly, example embodiments of the present invention may propose a three dimensional flash memory where each of an upper wiring layer, a lower wiring layer, and at least one intermediate wiring line located between the upper wiring layer and the lower wiring layer is formed to be reconfigurable to be adaptively used as any one of a source electrode or a drain electrode and a manufacturing method thereof.

Accordingly, example embodiments of the present invention may propose a technology for solving disadvantages of cell current decrease and cell degradation that an existing three dimensional flash memory has.

BEST MODE FOR CARRYING OUT THE INVENTION

Hereinafter, embodiments of the present invention will be described in detail with reference to the accompanying drawings. Although limited embodiments are described hereinafter, the embodiments are examples of the present invention, and same reference on the drawings indicates the same member.

Also, the terminologies used herein refer to terms used to appropriately represent the example embodiments and may vary based on a reader, the intent of an operator, or custom of a field to which this disclosure belongs, and the like. Accordingly, the definition of the terms should be made based on the overall description of the present specification.

Figure 3:
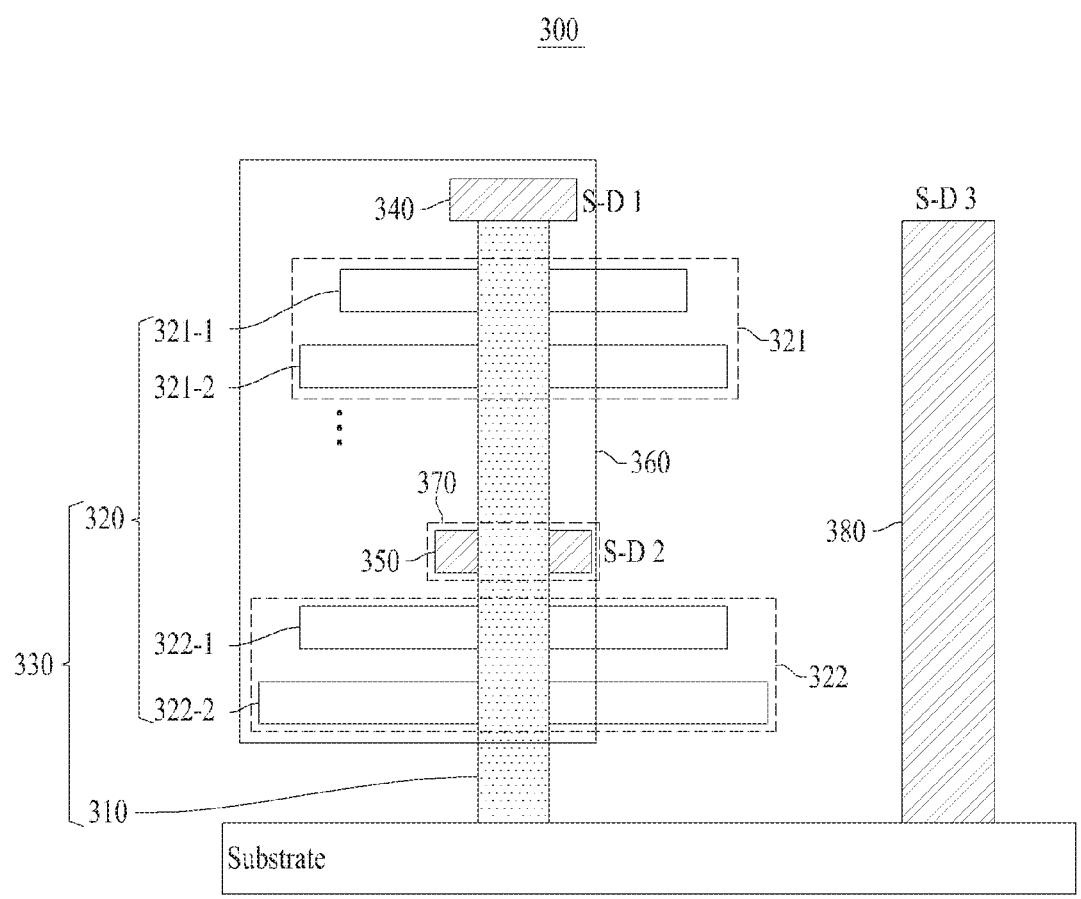
FIG. 3 is a cross sectional drawing representing a three dimensional flash memory element according to an example embodiment of the present invention.

FIG. 3 is a cross sectional drawing representing a three dimensional flash memory element according to an example embodiment of the present invention.

Referring to FIG. 3, a three dimensional flash memory element 300 includes a string 330 including a channel layer 310 and a plurality of electrode layers 320 vertically layered to the channel layer 310, an upper wiring layer 340, and at least one intermediate wiring layer 350.

Hereinafter, the three dimensional flash memory element 300 is described as including the described elements, but not limited thereto, and may further include a charge storage layer (not illustrated in the drawing) formed to connect the channel layer 310 and a plurality of electrode layers 320 and a plurality of interlayer insulating layers (not illustrated in the drawing) alternately placed with the plurality of electrode layers 320 and vertically layered for the channel layer 310. In other words, the three dimensional flash memory element 300 may have a structure further including the existing elements described with referring to FIG. 2.

The channel layer 300 is extended in one direction. For example, the channel layer 310 may be extended in z-axis described with referring to FIG. 2.

The plurality of electrode layers 320 is vertically layered for the channel layer 310. At this point, the plurality of electrode layers 320 may be extended in x-axis described with referring to FIG. 2.

Here, the plurality of electrode layers 320 may be grouped into at least two blocks 321, 322 divided by at least one intermediate wiring layer 350. For example, a first electrode layer 321-1 and a second electrode layer 321-2 may be grouped into a first block 321, and a third electrode layer 322-1 and a fourth electrode layer 322-2 may be grouped into a second group 322.

Figure 4:
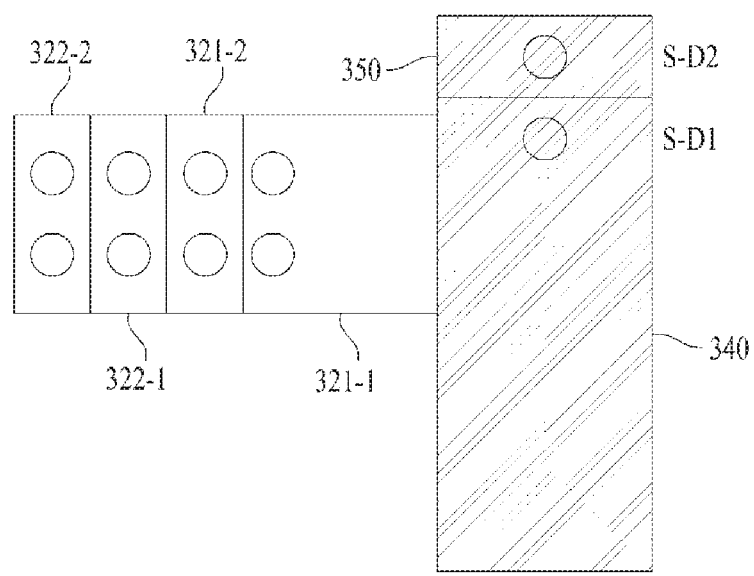
FIG. 4 represents a top view for 360 area in the three dimensional flash memory element illustrated in FIG. 3.

Also, the lengths of each of the plurality of electrode layers 320 extending in a direction perpendicular to the channel layer 310 may be different from each other. For example, referring to FIG. 4 representing a top view for 360 area, the extended lengths may be longer in order of the first electrode layer 321-1, the second electrode layer 321-2, the third electrode layer 322-1, and the fourth electrode layer 322-2. Therefore, the plurality of electrode layers 320 may be formed in a stepped form where the lengths become longer and shorter in order. However, it is not limited thereto, the lengths extended in order of the fourth electrode layer 322-2, the third electrode layer 322-1, the second electrode layer 321-2, and the first electrode layer 321-1 may become longer in order. Likewise, in this case, the plurality of electrode layers 320 may be formed in a stepped form from the side view.

The upper wiring layer 340 is placed at the top of the string 330 (exactly, the channel layer 310). At this point, the upper wiring layer 340 may be extended in a direction orthogonal to a direction where the plurality of electrode layers 320 is extended (a direction orthogonal to a direction where the plurality of electrode layers 320 is extended on the plane). In other words, the upper wiring layer 340 may be extended in the y-axis direction described with referring to FIG. 2.

The at least one intermediate wiring layer 350 is placed between the plurality of electrode layers 320 at the intermediate area of the string 330. Here, the at least one intermediate wiring layer 350 may be extended in a direction orthogonal to a direction where the plurality of electrode layers 320 is extended (a direction orthogonal to a direction where the plurality of electrode layers 320 is extended on the plane). For example, the at least one intermediate wiring layer 350 may be extended in a direction (the y-axis direction described with referring to FIG. 2) orthogonal to a direction (the x-axis direction described with referring to FIG. 2) where the plurality of electrode layers 320 are extended on the plane.

Figure 5A:
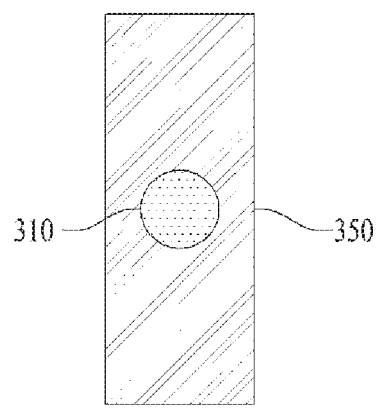
FIGS. 5A to 5C represent a top view for 370 area in the three dimensional flash memory element illustrated in FIG. 3.
Figure 5B:
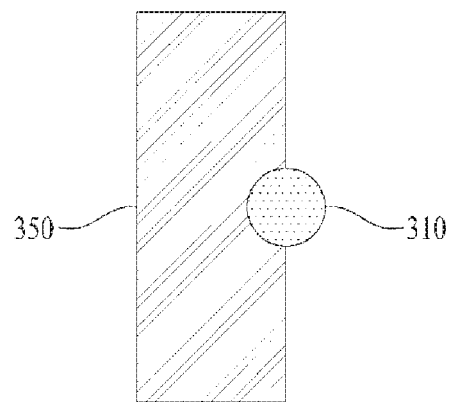
Figure 5C:
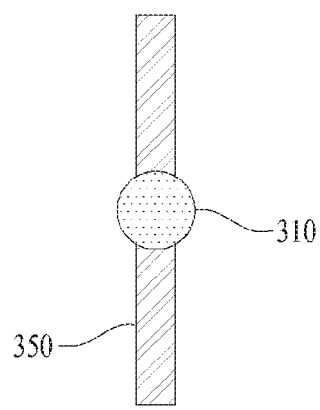

In particular, the at least one intermediate wiring layer 350 may have a structure that at least part of it is penetrated by the channel layer 310. For example, referring to FIGS. 5A to 5C representing a top view for 370 area, the at least one intermediate wiring layer 350 may have any one structure among 5A, 5B, or 5C where at least part of it is penetrated by the channel layer 310. A detailed description for a manufacturing method of three dimensional flash memory element 300 having this structure will be described with referring to FIG. 9.

Figure 1:
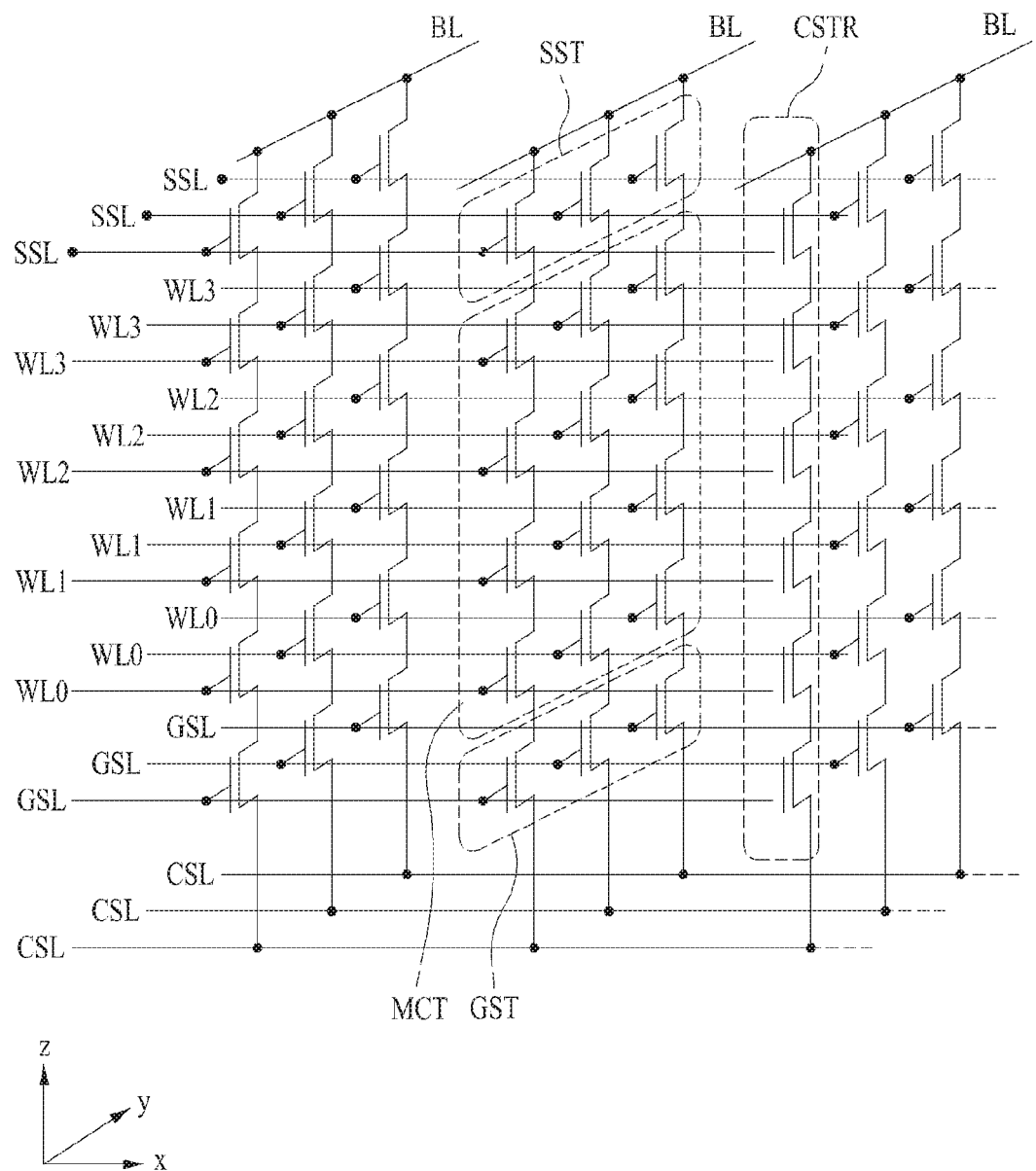
FIG. 1 is a simple circuit diagram representing an array of an existing three dimensional flash memory.

Each of the upper wiring layer 340 and at least one intermediate wiring layer 350 having this structure may be used as any one of a drain electrode or a source electrode in the three dimensional flash memory element. Here, being used as the drain electrode may mean being used as the BL illustrated in FIG. 1, and the wiring layers 340, 350 used as the drain electrode (or the source electrode) may mean that the wiring layers 340, 350 themselves are used as the drain electrode (or the source electrode) as well as an electrode directly connected to the wiring layers 340, 350 may be used as the drain electrode (or the source electrode).

For example, when the upper wiring layer 340 is used as the source electrode, the at least one intermediate wiring layer 350 which places a memory cell to control with the upper wiring layer 340 in between and is adjacent most closely may be used as the drain electrode, and when the upper wiring layer 340 is used as the drain electrode, the at least one intermediate wiring layer 350 which places a memory cell to control with the upper wiring layer 340 in between and is adjacent most closely may be used as the source electrode. Hereinafter, the memory cell means a charge storage layer which is information storage element and an electrode directly contacting to the charge storage layer. Accordingly, the three dimensional flash memory element 300 according to an example of embodiments of the present invention may include a plurality of charge storage layers corresponding to the plurality of electrode layers 320 by including the plurality of electrode layers 320, and include a plurality of memory cells formed by forming the plurality of electrode layers 320 and the plurality of charge storage layers in pairs.

As another example, when the at least one intermediate wiring layer 350 is implemented in plural such as a first intermediate wiring layer, a second intermediate wiring layer, and a third intermediate wiring layer (when placing them in sequential order of the first intermediate wiring layer, the second intermediate wiring layer, and the third intermediate wiring layer), as the first intermediate wiring layer is used as the drain electrode, the second intermediate wiring layer which places a memory cell to control with the first intermediate wiring layer in between and is adjacent most closely may be used as the source electrode. Also, as the third intermediate wiring layer is used as the source electrode, the second intermediate wiring layer which places a memory cell to control with the third intermediate wiring layer in between and is adjacent most closely may be used as the drain electrode. Likewise, the second intermediate wiring layer may be used as the source electrode or the drain electrode depending on whether the adjacent another intermediate wiring layer is used as any one of the drain electrode or source electrode.

In other words, each of the upper wiring layer 340 and the at least one intermediate wiring layer 350 may be adaptively used as the rest one of the drain electrode or the source electrode except any one of them which another wiring layer is used as in response that another wiring layer placing a memory cell to control in between is used as the any one of the drain electrode or the source electrode. Hereinafter, one wiring layer which may be used as the drain electrode or the source electrode as the case may be means that the corresponding wiring layer is formed to be reconfigurable to be used as any one of the source electrode or the drain electrode. Accordingly, the upper wiring layer 340 and the intermediate wiring layer 350 may be formed to be reconfigurable.

At this point, the upper wiring layer 340 and the at least one intermediate wiring layer 350 may be provided to correspond to each of the at least two blocks 321, 322 where the plurality of electrode layers 320 is grouped. For example, the upper wiring layer 340 may be provided to correspond to the first block 321 where the first electrode layer 321-1 and the second electrode layer 321-2 are grouped, and used as the drain electrode or the source electrode for the first block 321 (the first electrode layer 321 and the second electrode layer 321-2), and the at least one intermediate wiring layer 350 may be provided to correspond to the second block 322 where the third electrode layer 322-1 and the fourth electrode layer 322-2 are grouped, and used as the drain electrode or the source electrode for the second block 322 (the third electrode layer 322-1 and the fourth electrode layer 322-2). Therefore, the three dimensional flash memory element 300 may selectively program, erase, and read for a charge storage layer corresponding to any one electrode layer among electrode layers using a corresponding wiring layer by selecting any one of the upper wiring layer 340 and the at least one intermediate wiring layer 350 and using it as the drain electrode and the source electrode. Also, it is not limited thereto, and the three dimensional flash memory element 300 may be regard the plurality of electrode layers 320 as one block, and each of the upper wiring layer 340 and the at least one intermediate wiring layer 350 may be used as the source electrode or the drain electrode. A detailed description thereof will be descried with referring to FIG. 12.

Hereinafter, although it is described that the at least one intermediate wiring layer 350 is one, it is not limited thereto, and a plurality of intermediate wiring layers 350 may be provided. In this case as well, a plurality of intermediate wiring layers may be placed between the plurality of electrode layers 320.

Therefore, the three dimensional flash memory element 300 according to an example of embodiment of the present invention may improve cell current decrease and cell degradation compared to the existing three dimensional flash memory element including only one drain electrode at the top of a channel layer.

Also, the upper wiring layer 340 and the at least one intermediate wiring layer 350 may have extended lengths different from each other. For example, referring to FIG. 4 representing a top view for 360 area, the extended lengths of the upper wiring layer 340 and the at least one intermediate wiring layer 350 may become longer in order as it goes down to the bottom of the three dimensional flash memory element 300. Therefore, the upper wiring layer 340 and the at least one intermediate wiring layer 350 may be formed in a stepped form where the extended lengths become longer from the side view.

Also, similarly when the at least one intermediate wiring layer 350 is provided in plural, a plurality of intermediate wiring layers has extended lengths which become longer in order as it goes down to the bottom of the three dimensional flash memory element 300.

However, it does not limited thereto, the extended lengths of the upper wiring layer 340 and the at least one intermediate wiring layer 350 may become shorter as it goes down to the bottom of the three dimensional flash memory element 300, and when the at least one intermediate wiring layer 350 is provided in plural, the extended lengths of the plurality of intermediate wiring layers 350 may become shorter as it goes down to the bottom of the three dimensional flash memory element 300. Likewise, in this case, the upper wiring layer 340 and the at least one intermediate wiring layer 350 may be formed in a stepped form from the side view.

Because of this stepped form, an effect for lowering complexity of wiring process relating to the at least one intermediate wiring layer 350 and the upper wiring layer 340 may be achieved.

The three dimensional flash memory element 300 may further include a lower wiring layer 380 corresponding to the upper wiring layer 340 and the at least one intermediate wiring layer 350. Here, the lower wiring layer 380 may be adaptively used as any one of the source electrode or the drain electrode as the upper wiring layer 340 and the at least one wiring layer 350. For example, when the at least one intermediate wiring layer 350 which places a memory cell to control with the lower wiring layer 380 in between and is adjacent most closely is used as the source electrode, the lower wiring layer 380 may be used as the drain electrode. On the other hand, when the intermediate wiring layer 350 which placed a memory cell to control with the lower wiring layer 380 and is adjacent most closely is used as the drain electrode, the lower wiring layer 380 may be used as the source electrode.

Here, the lower side of the upper wiring layer 340, the upper or lower side of the at least one intermediate wiring layer 350, and the upper side of the lower wiring layer 380 may be dope with at least one of N+ type or N− type. Hereinafter, doping the lower side of the upper wiring layer 340, the upper or lower side of the at least one intermediate wiring layer 350, and the upper side of the lower wiring layer 380 with N+ type or N− type may mean that the lower side of the upper wiring layer 340, the upper or lower side of the at least one intermediate wiring layer 350, and the upper side of the lower wiring layer 380 themselves may be doped with N+ type or N− type by N+ type or N− type ion implantation and annealing process for a channel layer directly contacting to the upper wiring layer 340, the at least one intermediate wiring layer 350, and the lower wiring layer 380. This will be described with referring to FIG. 9.

However, it is not limited thereto, the doping the lower side of the upper wiring layer 340, the upper or lower side of the at least one intermediate wiring layer 350, and the upper side of the lower wiring layer 380 with N+ type or N− type may mean that N+ type doping layer or N− type doping layer is deposited on the lower side of the upper wiring layer 340, the upper or lower side of the at least one intermediate wiring layer 350, and the upper side of the lower wiring layer 380. This will be described with referring to FIGS. 20 to 22.

The upper wiring layer 340, the at least one intermediate wiring layer 350, and the lower wiring layer 380 may be formed of at least one of W, Ti, Ta, Au, or Au. However, it is not limited thereto, the upper wiring layer 340, the at least one intermediate wiring layer 350, and the lower wiring layer 380 may be formed of metal materials as well as nonmetallic materials or mixed materials of metal materials and nonmetallic materials.

As described above, it is described for the three dimensional flash memory element 300 including one string 330, but the three dimensional flash memory element 300 may include a plurality of strings 330 having the described structure.

Figure 6:
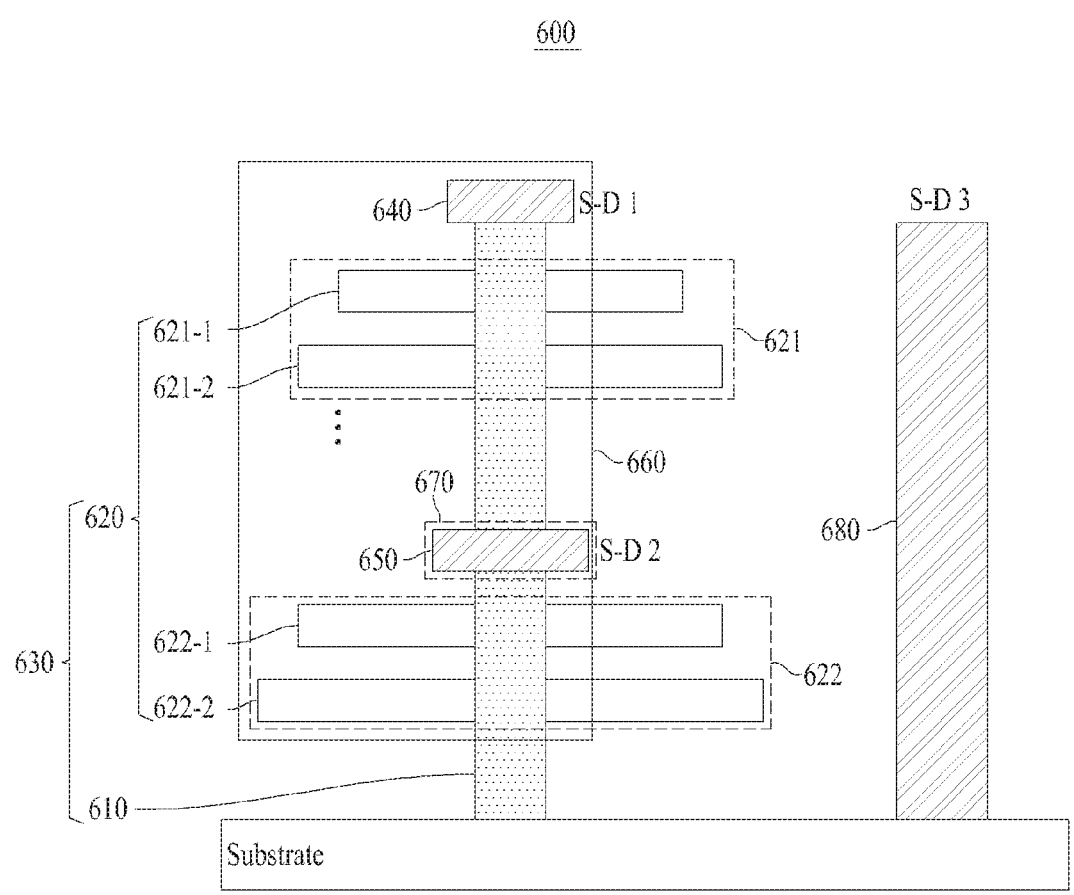
FIG. 6 is a cross sectional drawing representing a three dimensional flash memory element according to another example embodiment of the present invention.

FIG. 6 is a cross sectional drawing representing a three dimensional flash memory element according to another example embodiment of the present invention.

Referring to FIG. 6, like the three dimensional flash memory element described with referring to FIG. 3, a three dimensional flash memory element 600 according to another example of embodiment of the present invention has a feature of having a structure including a string 630 including a channel layer 610 and a plurality of electrode layers 620 vertically layered for the channel layer 610, an upper wiring layer 640, and at least one intermediate wiring layer 650, or that the at least one intermediate wiring layer 650 is formed in a different form for the channel layer 610.

Hereinafter, the three dimensional flash memory element 600 will be described as including the above described elements, but it is not limited thereto, and it may further include a charge storage layer (not illustrated in the drawing) formed to connect between the channel layer 610 and the plurality of electrode layers 620 and a plurality of interlayer insulating layers (not illustrated in the drawing) alternately placed with and the plurality of electrode layers 620 and vertically layered for the channel layer 610. In other words, the three dimensional flash memory element 600 may have a structure further including the existing elements described with referring to FIG. 2.

The channel layer 610 is extended in one direction. For example, the channel layer 610 may be extended in z-axis direction described with referring to FIG. 2.

The plurality of electrode layers 620 is vertically layered for the channel layer 610. At this point, the plurality of electrode layers 620 may be extended in x-axis direction described with referring to FIG. 2.

Here, the plurality of electrode layers 620 may be grouped into at least two blocks 621, 622 divided by the at least one intermediate wiring layer 650. For example, a first electrode layer 621-1 and a second electrode layer 621-2 may be grouped into a first block 621, and a third electrode layer 622-1 and a fourth electrode layer 622-2 may be grouped into a second block 622.

Figure 7:
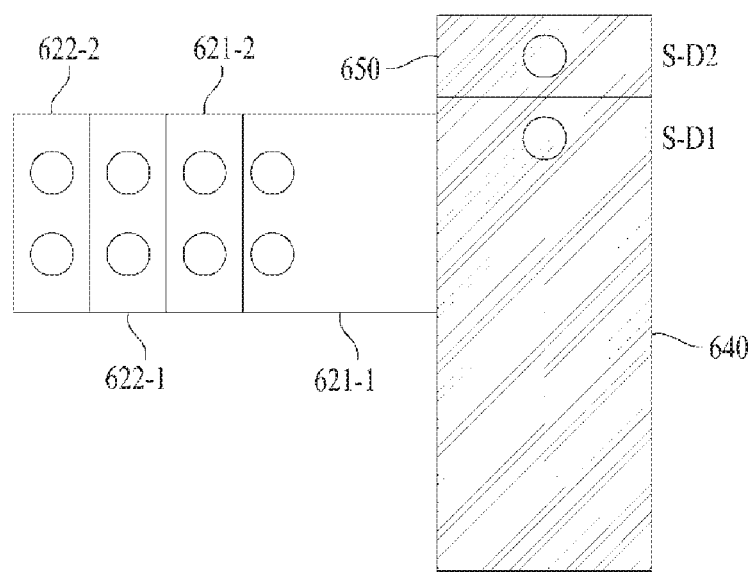
FIG. 7 represents a top view for 660 area in the three dimensional flash memory element illustrated in FIG. 6.

Also, lengths of each of the plurality of electrode layers 620 extending in a direction perpendicular to the channel direction may be different from each other. For example, referring to FIG. 7 representing a top view for 660 area, the extended lengths may become longer in order of the first electrode layer 621-1, the second electrode layer 621-2, the third electrode layer 622-1, and the fourth electrode layer 622-2. Therefore, the plurality of electrode layers 620 may be formed in a stepped form where lengths become longer in order at the side view. However, it is not limited thereto, and the lengths may become longer in order of the fourth electrode layer 622-2, the third electrode layer 622-1, the second electrode layer 621-2, and the first electrode layer 621-1. Similarly, in this case as well, the plurality of electrode layers 620 may be formed in a stepped form at the side view.

The upper wiring layer 640 is placed at the top of the string 630 (exactly, channel layer 610). At this point, the upper wiring layer 640 may be extended in a direction orthogonal to a direction where the plurality of electrode layers 620 is extended (a direction orthogonal to a direction where the plurality of electrode layer 620 is extended on the plane). In other words, the upper wiring layer 640 may be extended in y-axis direction described with referring to FIG. 2.

The at least one intermediate wiring layer 650 is placed between the plurality of electrode layers 620 in the intermediate area of the string 630. Here, the at least one intermediate wiring layers 650 may be extended in a direction orthogonal to a direction where the plurality of electrode layers 620 is extended (a direction orthogonal to a direction where the plurality of electrode layers 620 is extended on the plane). For example, the at least one intermediate wiring layer 650 may be extended in a direction (y-axis direction described with referring to FIG. 2) orthogonal to a direction (x-axis direction described with referring to FIG. 2) where the plurality of electrode layer 620 is extended on the plane.

Figure 8A:
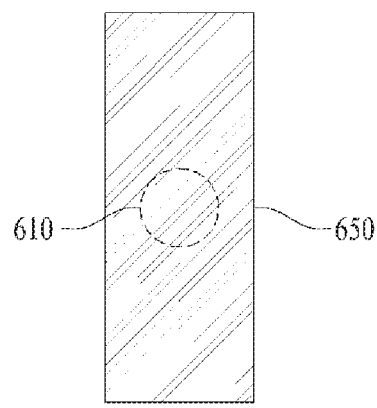
FIGS. 8A to 8C represent a top view for 670 area in the three dimensional flash memory element illustrated in FIG. 6.
Figure 8B:
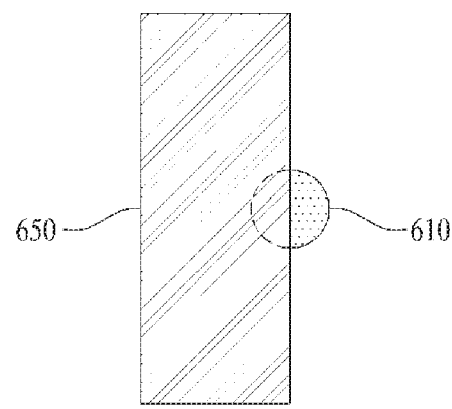
Figure 8C:
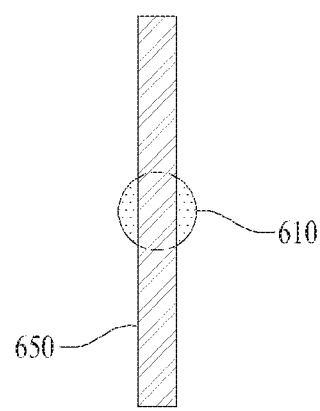

Particularly, the at least one intermediate wiring layer 650 may have a structure penetrating at least part of the channel layer 610 (having a structure that at least part of the channel layer 610 is penetrated by the at least intermediate wiring layer 650). For example, referring to FIGS. 8A to 8C representing a top view for 670 area, the at least one intermediate wiring layer 650 may have any one structure among 8A, 8B, or 8C penetrating at least part of the channel layer 610. A detailed description for a manufacturing method of the three dimensional flash memory element 600 having this structure will be described with referring to FIG. 10.

Each of the upper wiring layer 640 and at least one intermediate wiring layer 650 of this structure may be adaptively used as any one of a drain electrode or a source electrode. At this point, being used as the drain electrode may mean being used as the BL illustrated in FIG. 1, and the wiring layers 640, 650 used as the drain electrode (or the source electrode) may mean that the wiring layers 640, 650 themselves are used as the drain electrode (or the source electrode) as well as an electrode layer directly connected to the wiring layers 640, 650 is used as the drain electrode (or the source electrode).

For example, when the upper wiring layer 640 is used as the source electrode, the at least one intermediate wiring layer 650 which places a memory cell to control with the upper wiring layer 640 in between and is adjacent most closely may be used as the drain electrode, and when the upper wiring layer 640 is used as the drain electrode, the at least one intermediate wiring layer 650 which places a memory cell to control with the upper wiring layer 640 and is adjacent most closely may be used as the source electrode. Hereinafter, the memory cell means a charge storage layer which is information storage element and an electrode layer directly contacting to the charge storage layer in the three dimensional flash memory element 600. Accordingly, the three dimensional flash memory element 600 according to an example of embodiments of the present invention may include a plurality of charge storage layers corresponding to the plurality of electrode layers 620 by including the plurality of electrode layers 620, and include a plurality of memory cells formed by forming the plurality of electrode layers 620 and the plurality of charge storage layers in pairs.

As another example, when the at least one intermediate wiring layer 650 is implemented in plural such as a first intermediate wiring layer, a second intermediate wiring layer, and the third intermediate wiring layer (when placing them in sequential order of the first intermediate wiring layer, the second intermediate wiring layer, and the third intermediate wiring layer), as the first intermediate wiring layer is used as the drain electrode, the second intermediate wiring layer which places a memory cell to control with the first intermediate wiring layer and is adjacent most closely may be used as the source electrode. Also, as the third intermediate wiring layer is used as the source electrode, the second intermediate wiring layer which places a memory cell to control with the third intermediate wiring layer and is adjacent most closely may be used as the drain electrode. Likewise, the second intermediate wiring layer may be used as the source electrode or the drain electrode depending on whether the adjacent another intermediate wiring layer is used as any one of the drain electrode or source electrode.

In other words, each of the upper wiring layer 640 and the at least one intermediate wiring layer 650 may be adaptively used as the rest one of the drain electrode or the source electrode except any one of them which another wiring layer is used as in response that another wiring layer placing a memory cell to control in between is used as the any one of the drain electrode or the source electrode. Hereinafter, one wiring layer which may be used as the drain electrode or the source electrode as the case may be means that the corresponding wiring layer is formed to be reconfigurable to be used as any one of the source electrode or the drain electrode. Accordingly, the upper wiring layer 640 and the intermediate wiring layer 650 may be formed to be reconfigurable.

At this point, the upper wiring layer 640 and the at least one intermediate wiring layer 650 may be provided to correspond to each of the at least two blocks 621, 622 where the plurality of electrode layers 620 is grouped. For example, the upper wiring layer 640 may be provided to correspond to the first block 621 where the first electrode layer 621-2 and the second electrode layer 621-2 are grouped and used as the drain electrode or the source electrode for the first block 621 (the first electrode layer 621-1 and the second electrode layer 621-2), and the at least one intermediate wiring layer 650 may be provided to correspond to the second block 622 where the third electrode layer 622-1 and the fourth electrode layer 622-2 are grouped and used as the drain electrode or the source electrode for the second block 622 (the third electrode layer 622-1 and the fourth electrode layer 622-2). Therefore, the three dimensional flash memory element 600 may selectively program, erase, and read for a charge storage layer corresponding to any one electrode layer among electrode layers using a corresponding wiring layer by selecting any one of the upper wiring layer 640 and the at least one intermediate wiring layer 650 and using it as the drain electrode or the source electrode. Also, it is not limited thereto, and the three dimensional flash memory element 600 may regard the plurality of electrode layers 320 as one block, and each of the upper wiring layer 640 and the at least one intermediate wiring layer 650 may be used as the source electrode or the drain electrode. A detailed description thereof will be descried referring to FIG. 12.

Hereinafter, it is described that at least one intermediate wiring layer 650 is one, but it is not limited thereto, and it may be provided in plural. In this case as well, the plurality of intermediate wiring layers may be respectively placed between the plurality of electrode layers 620.

Therefore, the three dimensional flash memory element 600 according to another example of embodiments of the present invention may improve cell current decrease and cell degradation compared to the existing three dimensional flash memory element including only one drain electrode at the top of a channel layer.

Also, the extended lengths of the upper wiring layer 640 and the at least one intermediate wiring layer 650 may be different from each other. For example, referring to FIG. 7 representing a top view for 660 area, the extended lengths of the upper wiring layer 640 and the at least one intermediate wiring layer 650 may become longer in order as it goes down to the bottom of the three dimensional flash memory element 600. Therefore, the upper wiring layer 640 and the at least one intermediate wiring layer 650 may be formed in a stepped form where the extended lengths become longer and shorter in order from the side view.

Also, similarly when the at least one intermediate wiring layer 650 is provided in plural, a plurality of intermediate wiring layers has extended lengths which become longer in order as it goes down to the bottom of the three dimensional flash memory element 600.

However, it does not limited thereto, the extended lengths of the upper wiring layer 640 and the at least one intermediate wiring layer 650 may become shorter as it goes down to the bottom of the three dimensional flash memory element 600, and when the at least one intermediate wiring layer 650 is provided in plural, the extended lengths of the plurality of intermediate wiring layers 650 may also become shorter as it goes down to the bottom of the three dimensional flash memory element 600. Likewise, in this case, the upper wiring layer 640 and the at least one intermediate wiring layer 650 may be formed in a stepped form from the side view.

Because of this stepped form, an effect for lowering complexity of wiring process relating to the at least one intermediate wiring layer 650 and the upper wiring layer 640 may be achieved.

The three dimensional flash memory element 600 may further include a lower wiring layer 680 corresponding to the upper wiring layer 640 and the at least one intermediate wiring layer 650. Here, like the upper wiring layer 640 and the at least one intermediate wiring layer 650, the lower wiring layer 680 may be adaptively used as any one of the source electrode or the drain electrode. For example, when the at least one intermediate wiring layer 650 which places a memory cell to control with the lower wiring layer 680 in between and is adjacent most closely is used as the source electrode, the lower wiring layer 680 may be used as the drain electrode. On the other hand, when the intermediate wiring layer 650 which placed a memory cell to control with the lower wiring layer 680 in between and is adjacent most closely is used as the drain electrode, the lower wiring layer 680 may be used as the source electrode.

Here, the lower side of the upper wiring layer 640, the upper or lower side of the at least one intermediate wiring layer 650, and the upper side of the lower wiring layer 680 may be dope with at least one of N+ type or N− type. Hereinafter, doping the lower side of the upper wiring layer 640, the upper or lower side of the at least one intermediate wiring layer 650, and the upper side of the lower wiring layer 680 with N+ type or N− type may mean that the lower side of the upper wiring layer 640, the upper or lower side of the at least one intermediate wiring layer 650, and the upper side of the lower wiring layer 680 themselves may be doped with N+ type or N− type by N+ type or N− type ion implantation and annealing process for a channel layer directly contacting to the upper wiring layer 640, the at least one intermediate wiring layer 650, and the lower wiring layer 680. This will be described with referring to FIG. 10.

However, it is not limited thereto, the doping the lower side of the upper wiring layer 640, the upper or lower side of the at least one intermediate wiring layer 650, and the upper side of the lower wiring layer 680 with N+ type or N− type may mean that N+ type doping layer or N− type doping layer is deposited on the lower side of the upper wiring layer 640, the upper or lower side of the at least one intermediate wiring layer 650, and the upper side of the lower wiring layer 680. This will be described with referring to FIGS. 20 to 22.

As described above, it is described for the three dimensional flash memory element 600 including one string 630, but the three dimensional flash memory element 600 may include a plurality of strings 630 having the described structure.

Also, the above described three dimensional flash memory element 600 will be described in more detailed with referring to FIGS. 11A to 16.

Figure 9:
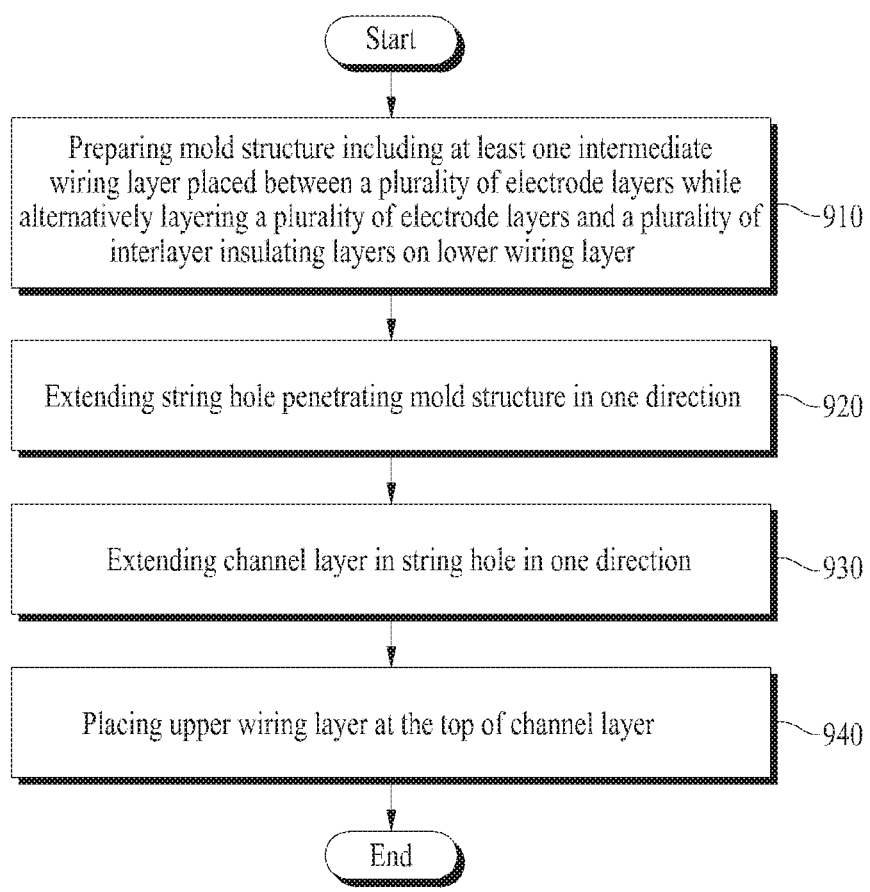
FIG. 9 is a flow chart representing a manufacturing method of three dimensional flash memory element according to an example embodiment of the present invention.

FIG. 9 is a flow chart representing a manufacturing method of three dimensional flash memory element according to an example embodiment of the present invention.

Referring to FIG. 9, a manufacturing method of three dimensional flash memory element according to an example of embodiments of the present invention is performed by a manufacturing system for three dimensional flash memory (hereinafter, a manufacturing system), and the three dimensional flash memory element manufactured through the manufacturing method has the structure described with referring to FIGS. 3 to 5C. Also, the manufacturing method is not limited to the following described steps, and various steps for making the three dimensional flash memory element has the above described structure with referring to FIGS. 3 to 5C may be applied.

First of all, the manufacturing system prepares a mold structure including at least one intermediate wiring layer placed between a plurality of electrode layers while the plurality of electrode layers and a plurality of interlayer insulating layers are alternately layered on a lower wiring layer 910.

For example, in Step 910, the manufacturing system may prepare the mold structure by placing the at least one intermediate wiring layer by etching part of any interlayer insulating layer located between electrodes in the intermediate area based on a direction where the plurality of interlayer insulating layers and the plurality of electrode layers are layered among the plurality of electrode layers (or by placing the at least one intermediate wiring layer at the top or bottom of the any interlayer insulating layer located between the electrodes in the intermediate area based on a direction where the plurality of interlayer insulating layers and the plurality of electrode layers are layered among the plurality of electrode layers) in a process extending the plurality of interlayer insulating layers and the plurality of electrode layers on a lower wiring layer in one direction (x-axis direction described with referring to FIG. 2) and alternatively layering them. Accordingly, the manufacturing system may place the at least one intermediate wiring layer extended in a direction orthogonal to a direction where the plurality of electrode layers is extended (y-axis direction described with referring to FIG. 2) between the plurality of electrode layers.

Subsequently, the manufacturing system extends a string hole penetrating the mold structure in a direction (z-axis direction described with referring to FIG. 2) 920.

Particularly, in Step 920, the manufacturing system may make the at least one intermediate wiring layer have a structure where at least part it is penetrated by a channel layer filled in the string hole in the manufactured three dimensional flash memory by expending the string hole in order that the string hole penetrates at least part of the intermediate wiring layer.

At this point, the manufacturing system may make the channel layer filled in the string hole contact to the lower wiring layer in Step 930 by extending the string hole in one direction until at least part of the lower wiring layer is exposed through the string hole.

Then, the manufacturing system expends the channel layer in one direction (z-axis direction described with referring to FIG. 2) to the string hole 930. As described above, because the string hole penetrates at least part of the intermediate wiring layer, a structure where the channel layer penetrates at least part of the intermediate wiring layer may be generated.

Afterward, the manufacturing system places an upper wiring layer at the top of the channel layer 940. In Step 940, the manufacturing system may extend the upper wiring layer in the same direction with the at least one intermediate wiring layer, and the upper wiring layer and the at least one intermediate wiring layer may be formed in a stepped form where lengths are different in order from the side view by making the extended length of the upper wiring layer different from the extended length of the at least one intermediate wiring layer in Step 910.

Also, it is not illustrated in the drawing, but the manufacturing system may dope the lower side of the upper wiring layer, the upper or lower side of the at least one intermediate wiring layer, and the upper side of the lower wiring layer with N+ type or N– type by using N+ type or N– ion implantation or annealing process through the top of the channel.

In the manufactured three dimensional flash memory element, each of the upper wiring layer, the at least one intermediate wiring layer, and the lower wiring layer is adaptively used as any one of the drain electrode or the source electrode.

As described above, the manufacturing method of three dimensional flash memory element including one string is described, but a three dimensional flash memory element including a plurality of strings may be also manufactured the same. For example, the manufacturing system may manufacture a three dimensional flash memory element by extending a plurality of string holes in Step 920, forming a channel layer in each of the plurality of string holes in Step 930, and placing upper wiring layers at the top of the plurality of channel layers in Step 940.

Figure 10:
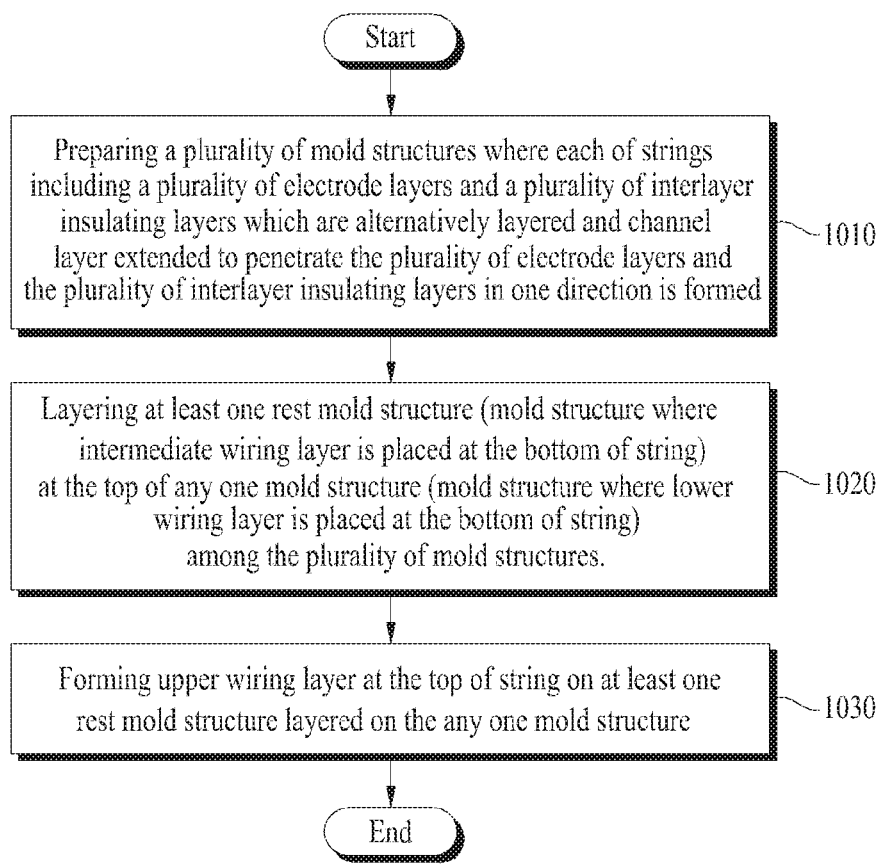
FIG. 10 is a flow chart representing a manufacturing method of three dimensional flash memory element according to another example embodiment of the present invention.
Figure 17A:
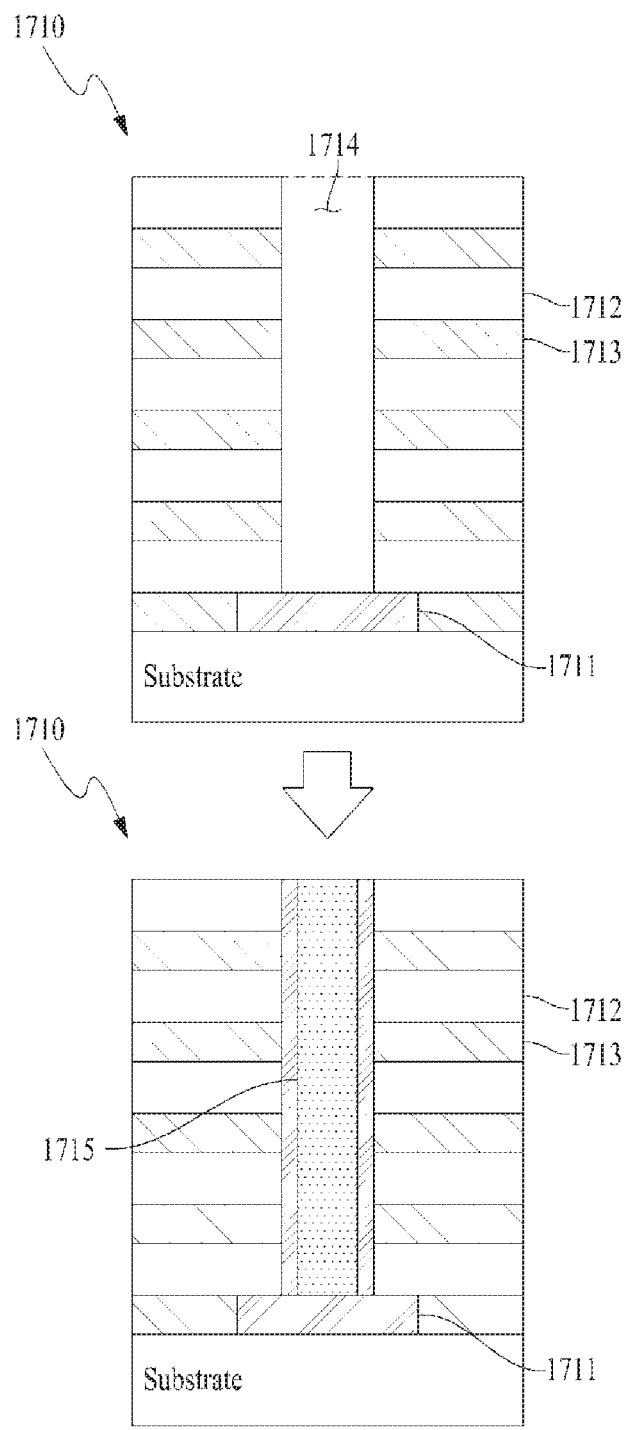
FIGS. 17A and 17B are drawings for describing Step 1010 illustrated in FIG. 10.
Figure 17B:
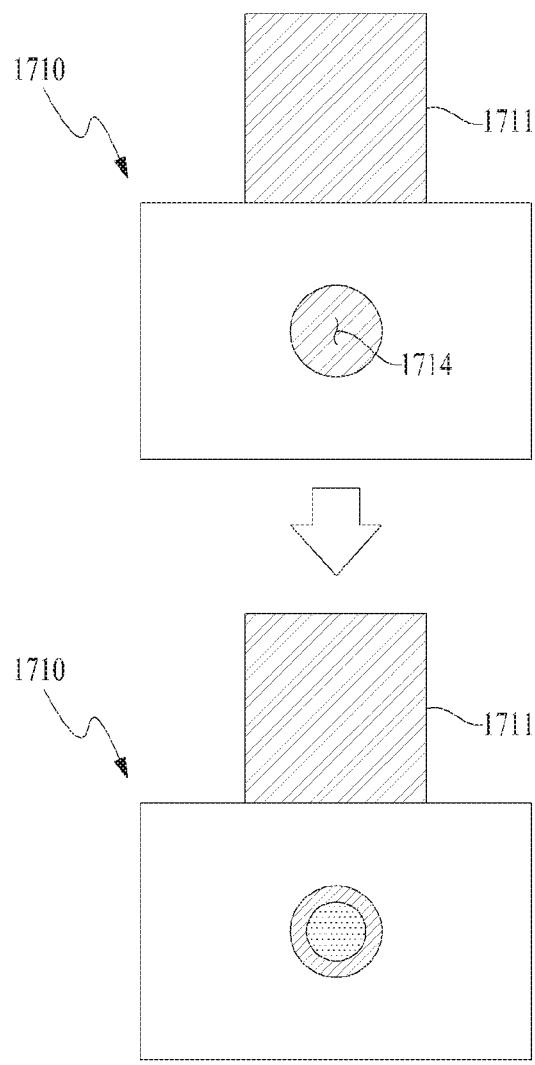
Figure 18A:
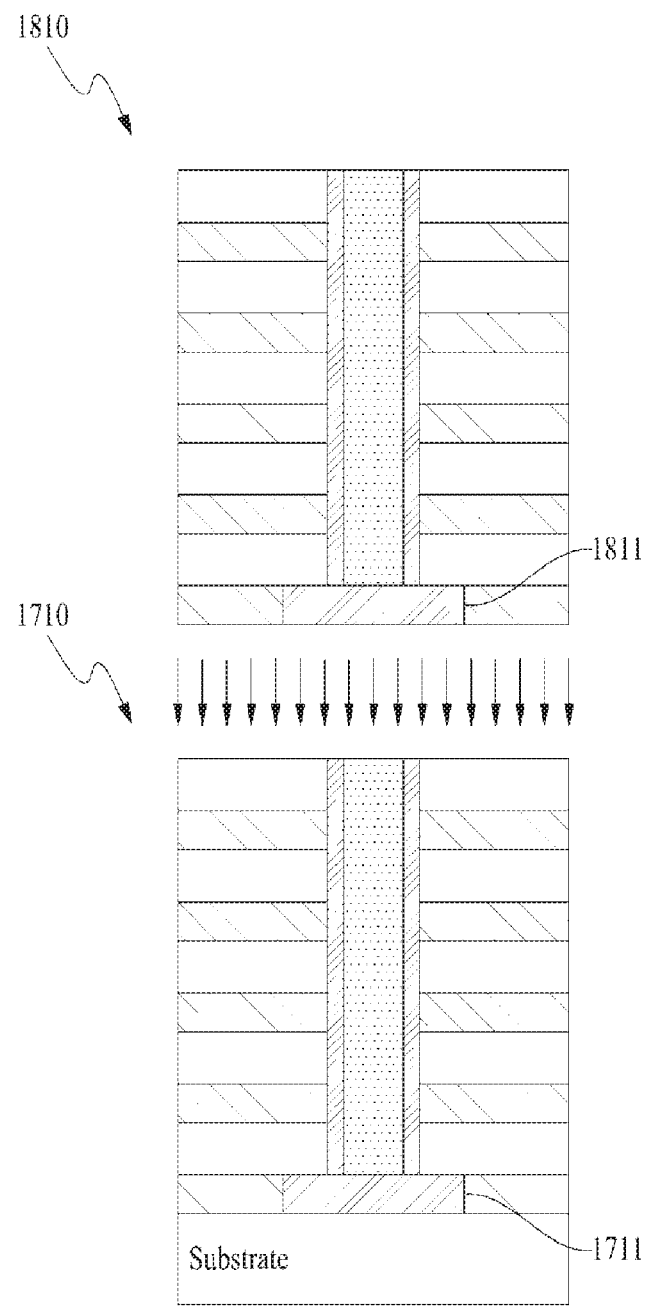
FIGS. 18A and 18B are drawings for describing Step 1020 illustrated in FIG. 10.
Figure 18B:
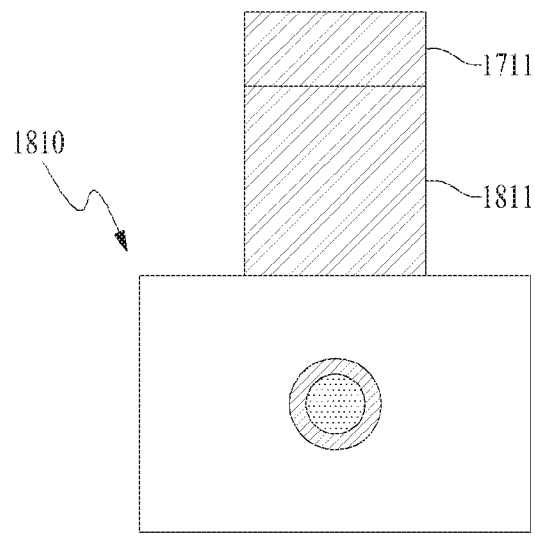
Figure 19A:
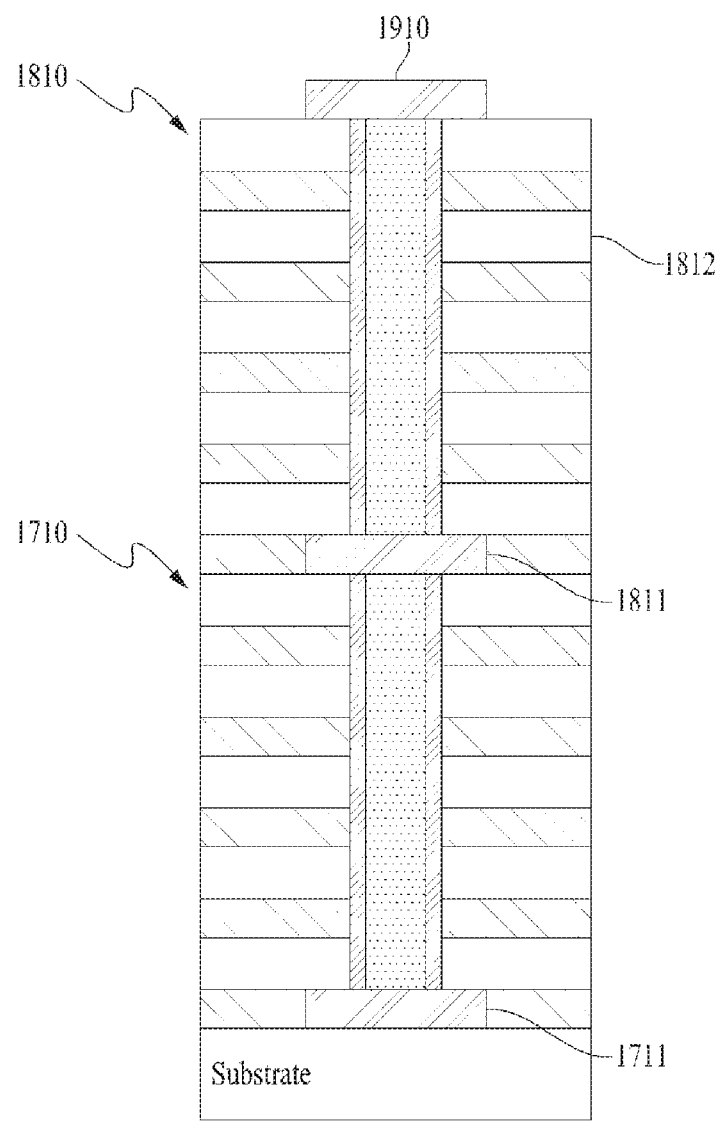
FIGS. 19A and 19B are drawings for describing Step 1030 illustrated in FIG. 10.
Figure 19B:
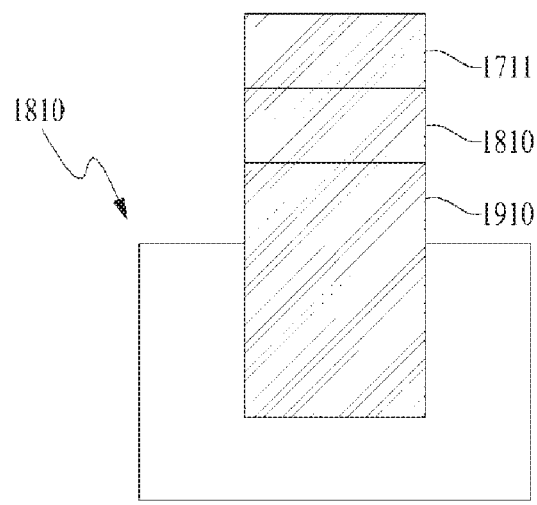

FIG. 10 is a flow chart representing a manufacturing method for three dimensional flash memory element according to another example of embodiments of the present invention, FIGS. 17A and 17B are drawings for describing Step 1010 illustrated in FIG. 10, FIGS. 18A and 18B are drawings for describing Step 1020 illustrated in FIG. 10, and FIGS. 19A and 19B are drawings for describing Step 1030 illustrated in FIG. 10.

Referring to FIGS. 10 to 19B, a manufacturing method for three dimensional flash memory element according to another example of embodiments of the present invention is performed by a manufacturing system for three dimensional flash memory (hereinafter, a manufacturing system), and a three dimensional flash memory element manufactured by the manufacturing method has the structure described with referring to FIGS. 6 to 8C. Also, the manufacturing method is not limited to the following described steps, and various steps to make the three dimensional flash memory element have the structure described with referring to FIGS. 6 to 8C may be applied.

First of all, the manufacturing system prepares a plurality of mold structures where each string including a plurality of electrode layers and a plurality of interlayer insulating layers alternatively layered and a channel layer extended to penetrate the plurality of electrode layers and the plurality of interlayer insulating layers in one direction (z-axis direction described with referring to FIG. 2) is formed 1010.

For example, in Step 1010, the manufacturing system may prepare the string including the plurality of electrode layers and the plurality of interlayer insulating layers alternatively layered and the channel layer extended to penetrate the plurality of electrode layers and the plurality of interlayer insulating layers in one direction and a lower mold structure where a lower wiring layer placed at the bottom of the string is formed, and prepare at least one intermediate mold structure which is the same with the lower mold structure, but an intermediate wiring layer is placed instead of the lower wiring layer at the bottom of the string. As more specific example, the manufacturing system may extend a plurality of electrode layers 1712 and a plurality of interlayer insulating layers 1713 in one direction (x-axis direction described with referring to FIG. 2) on a lower wiring layer 1711 as illustrated in a cross-sectional drawing FIG. 17A and a top view drawing FIG. 17B and alternatively layer them, then, extend a string hole 1714 penetrating the layered plurality of electrodes 1712 and plurality of interlayer insulating layers 1713 in another direction (z-axis direction described with referring to FIG. 2), and generate a lower mold structure 1710 by filling a channel layer 1715 to the string hole 1713 and extending it. Likewise, the manufacturing system may prepare a plurality of mold structures by generating at least one intermediate mold structure as the same with the process for generating the lower mold structure 1710 (but, placing an intermediate wiring layer instead of the lower wiring layer 1711 at the location of the lower wiring layer 1711). Hereinafter, it is described that one intermediate mold structure where an intermediate layer is placed is prepared and a three dimensional flash memory element including one intermediate wiring layer is manufactured, but it is not limited thereto, and a plurality of intermediate mold structures is prepared and a three dimensional flash memory element including a plurality of intermediate wiring layers may be manufactured.

In each of the plurality of mold structures, the lower wiring layer 1711 and the intermediate wiring layer may be extended in a direction orthogonal to a direction where the plurality of electrode layers 1712 is extended. Particularly, lengths of the lower wiring layer 1711 and the intermediate wiring layer may be different from each other in order that the lengths of the lower wiring layer 1711 and the intermediate wiring layer become shorter or longer in order when layering at least intermediate mold structure where the intermediate wiring layer is placed at the top of the lower mold structure 1710 where the lower wiring layer is placed 1711. For example, the lower wiring layer 1711 of the lower mold structure 1710 may be extended to the longest, and the intermediate wiring layer of the at least one intermediate mold structure may be extended to shorter than the lower wiring layer 1711. If the at least one intermediate mold structure where the intermediate wiring layer is placed is provided in plural, the plurality of intermediate mold structures may also include intermediate wiring layers extended with different lengths. For example, an extended length of an intermediate wiring layer of a first intermediate mold structure which will be layered at the top of the lower intermediate mold structure 1710 may be longer than an extended length of an intermediate wiring layer of a second intermediate mold structure which will be layered at the top of the first intermediate mold structure.

At this point, in preparing the at least one intermediate mold structure where the intermediate wiring layer is formed in Step 1010, the manufacturing system may dope the upper side of the intermediate wiring layer with N+ type or N− type by depositing N+ type doping layer or N− doping layer at the top of the intermediate wiring layer. A detailed description thereof will be described with referring to FIGS. 20 to 22.

Also, the manufacturing system may form a charge storage layer directly contacting to the plurality of electrode layers 1712 at inside surface of the string hole 1714 before filling and forming the channel layer 1715 in the string hole 1714. Accordingly, the channel layer 1715 may face to the plurality of electrode layers 1712 with the charge storage layer placed between them.

Then, the manufacturing system layers at least one rest mold structure where the intermediate wiring layer is placed at the bottom of the string among the plurality of mold structures at the top of the at least one mold structure where the lower wiring layer is placed at the bottom of the string 1020. For example, in Step 1020, the manufacturing system may layer an intermediate mold structure 1810 at the top of the lower mold structure 1710 in order that the location of the string on the lower mold structure 1710 where the lower wiring layer 1711 is placed is matched with the location of the string on the intermediate mold structure 1810 where an intermediate wiring layer 1811 is placed as illustrated in a cross-sectional drawing FIG. 18A and a top view drawing FIG. 18B. If the intermediate mold structure 1810 where the intermediate wiring layer is placed is provided in plural, the plurality of intermediate mold structures may be layered at the top of the lower mold structure 1710 in order. Particularly, the order that the plurality of intermediate mold structures is layered may be determined according to the extended length of the intermediate wiring layer of each of the plurality of intermediate mold structures. For example, when the length of the lower wiring layer 1711 is extended to the longest, a first intermediate mold structure including an intermediate wiring layer extended to the second longest among the intermediate mold structures may be layered at the top of the lower mold structures 1710, and a second intermediate mold structure including an intermediate wiring layer extended to the longest following the length of the intermediate wiring layer of the first intermediate mold structure among the intermediate mold structures may be layered at the top of the first intermediate mold structure. In other words, the order that the plurality of intermediate mold structures is layered may be determined in order that the form that each of intermediate wiring layers is extended with the lower wiring layer of the lower mold structure is a stepped form.

Afterward, the manufacturing system forms an upper wiring layer at the top of the string in the at least one rest mold structure where the intermediate wiring layer is placed at the bottom of the string layered at any one mold structure where the lower wiring layer is placed at the bottom of the string 1030. For example, the manufacturing method may extend an upper wiring layer 1910 in a direction orthogonal to a direction where the plurality of electrode layers 1812 is extended in the intermediate mold structure 1810 (y-axis direction described with referring to FIG. 2) as illustrated in a cross sectional drawing FIG. 19A and a top view drawing FIG. 19B. At this point, the extended length of the upper wiring layer 1910 may be shorter or longer than the length of the intermediate wiring layer 1811 placed in the intermediate mold structure 1810, so the intermediate wiring layer 1811 and the upper wiring layer 1910 may have different extended lengths from each other and have a stepped form that the lengths become shorter and longer in order from the side view.

Also, it is not illustrated in the drawing, but the manufacturing system may dope the lower side of the upper wiring layer 1910, the upper or lower side of the intermediate wiring layer 1811, and the upper side of the lower wiring layer 1711 with N+ type or N− type by using N+ type or N− type ion implantation and annealing process through the top of the channel layer 1715.

In the manufactured three dimensional flash memory element, each of the upper wiring layer, the at least one intermediate wiring layer and the lower wiring layer may be adaptively used as any one of the drain electrode or the source electrode.

As described above, the manufacturing method of three dimensional flash memory element including one intermediate wiring layer 1811 is described, but a three dimensional flash memory element including a plurality of intermediate wiring layers 1811 may be manufactured based on the above described steps. For example, the manufacturing system may manufacture the three dimensional flash memory element including the plurality of intermediate wiring layers by layering the plurality of intermediate mold structures in order at the top of the lower mold structure 1710 in Step 1020 and forming an upper wiring layer at the intermediate structure placed at the uppermost among the intermediate mold structures in Step 1030.

Also, the manufacturing method of three dimensional flash memory element including one string is described, but a three dimensional flash memory element including a plurality of strings may be also manufactured as the same. For example, the manufacturing system may manufacture a three dimensional flash memory element including a plurality of strings by preparing mold structures where a plurality of strings including the channel layer extended to penetrate the plurality of electrode layers and the plurality of interlayer insulating layers in one direction in Step 1010, and forming each of upper wiring layers at the top of the string in the at least one rest mold structure in Step 1030.

FIGS. 11 A and 11B are drawings for describing the three dimensional flash memory element illustrated in FIG. 6.

Figure 11A:
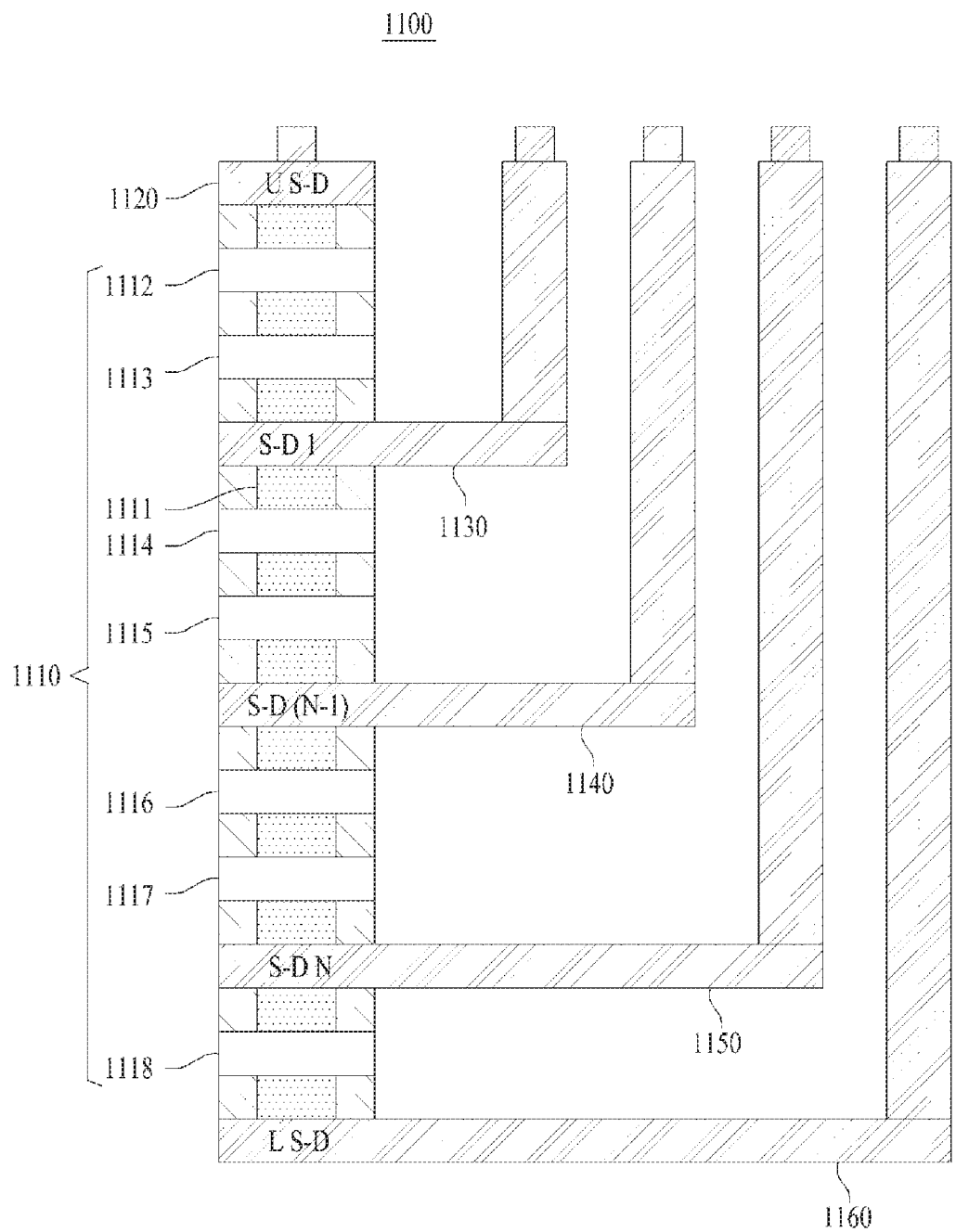
FIGS. 11A and 11B are drawings for describing the three dimensional flash memory element illustrated in FIG. 6.
Figure 11B:
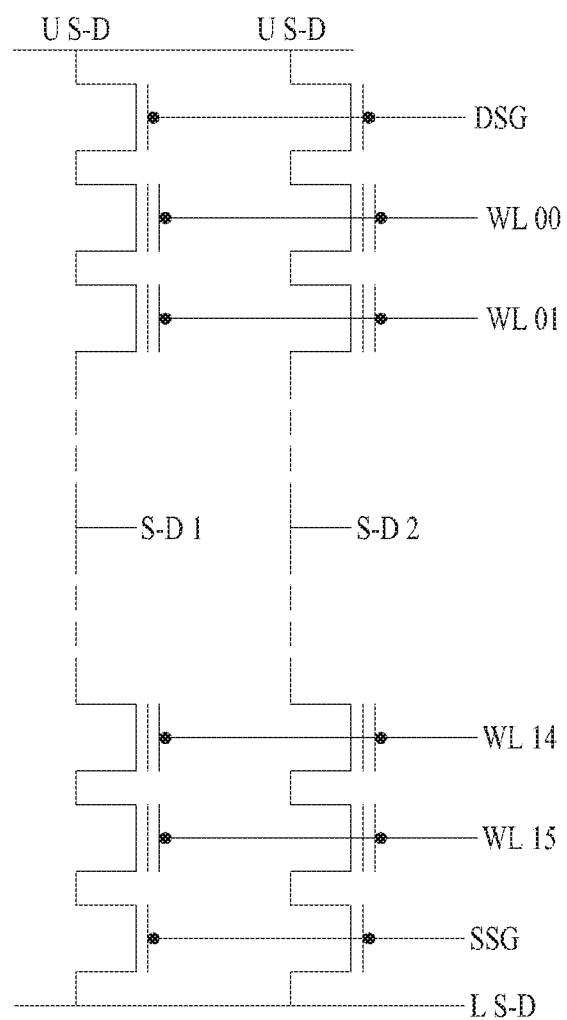

Referring to FIGS. 11A and 11B, a three dimensional flash memory element 1100 includes a string 1110 including a channel layer 1111 extended in one direction and a plurality of electrode layers 1112, 1113, 1114, 1115, 1116, 1117, 1118 vertically layered for the channel layer 1111, an upper wiring layer 1120 placed at the top of the string 1110, at least one intermediate wiring layer 1130, 1140, 1150 placed between the plurality of electrode layers 1113 and 1114, 1115 and 1116, 1117 and 1118 in the intermediate area of the string 1110, and a lower wiring layer 1160 placed at the bottom of the string. Hereinafter, it is described that the three dimensional flash memory element 1110 includes three of the at least one intermediate wiring layers 1130, 1140, 1150, but it may include one or two or include more than four.

Figure 2:
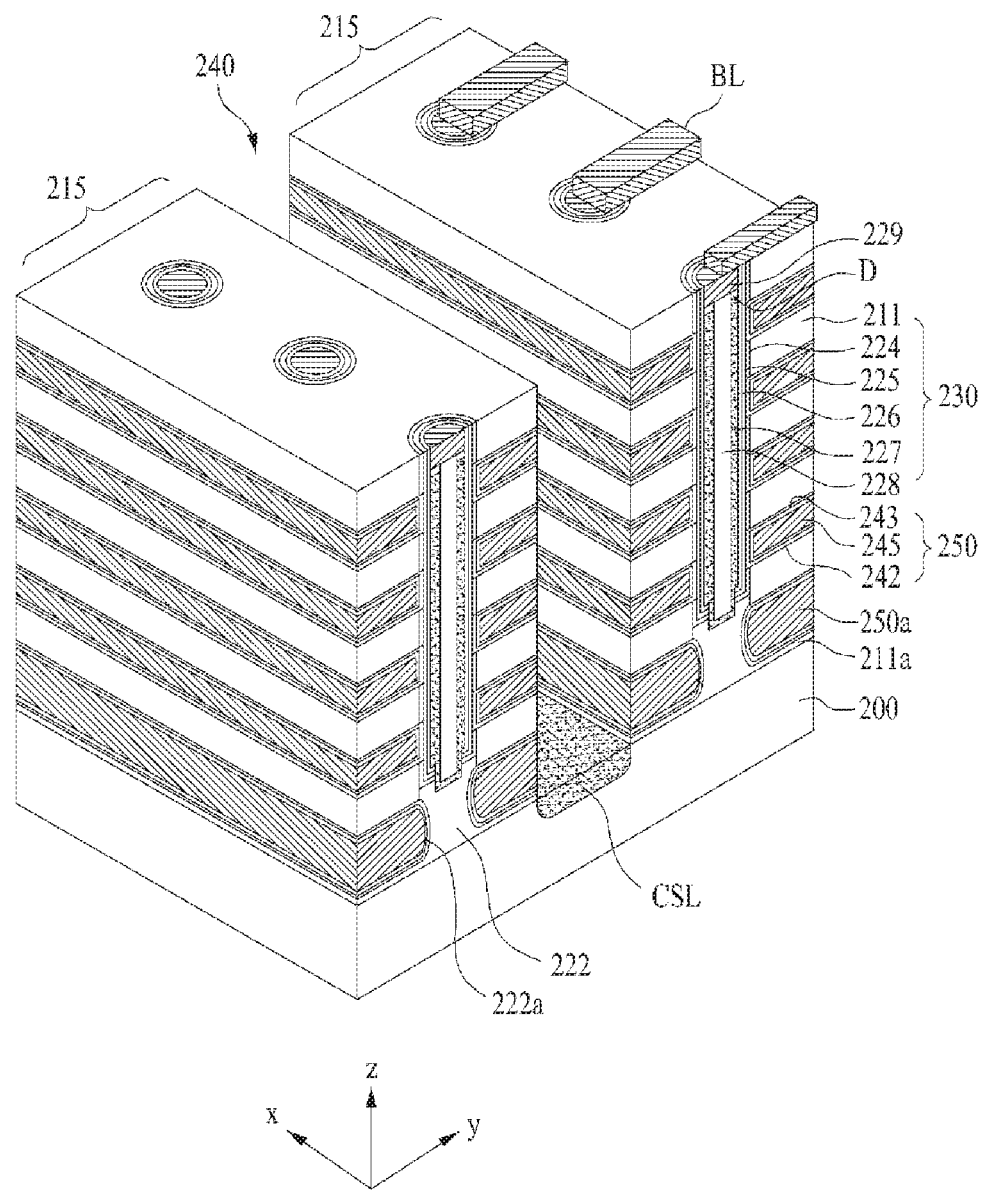
FIG. 2 is a perspective view representing structure of an existing three dimensional flash memory.

Here, the upper wiring layer 1120, the intermediate wiring layer 1130, 1140, 1150, and the lower wiring layer 1160 is extended in a direction orthogonal to a direction where the plurality of electrode layers 1112, 1113, 1114, 1115, 1116, 1117, 1118 is extended (for example, because the plurality of electrode layers 1112, 1113, 1114, 1115, 1116, 1117, 1118 is extended in x-axis direction described with referring to FIG. 2, the upper wiring layer 1120 and the intermediate wiring layers 1130, 1140 are extended in y-axis direction described with referring to FIG. 2) with different lengths from each other, so they may have a stepped form. In other words, the upper wiring layer 1120 located at the uppermost may be extended to the shortest length, the first intermediate wiring layer 1130, the second intermediate wiring layer 1140, and the third intermediate wiring layer 1150 may become longer and extended in order, and the lower wiring layer 1160 may be extended to the longest length. However, it may not limited thereto, the lower wiring layer 1160 located at the lowest may be extended to the shortest length, the third intermediate wiring layer 1150, the second intermediate wiring layer 1140, and the first intermediate wiring layer 1130 may become longer and extended in order, and the upper wiring layer 1120 may be extended to the longest length.

As the upper wiring layer 1120, the intermediate wiring layers 1130, 1140, 1150, and the lower wiring layer 1160 have a stepped form structure, complexity of wiring process relating to the upper wiring layer 1120, the intermediate wiring layers 1130, 1140, 1150, and the lower wiring layer 1160 may be reduced.

Meanwhile, it is described above, but each of the upper wiring layer 1120, the intermediate wiring layers 1130, 1140, 1150, and the lower wiring layer 1160 may be adaptively used as any one of a source electrode or a drain electrode. At this point, each of the upper wiring layer 1120, the intermediate wiring layers 1130, 1140, 1150, and the lower wiring layer 1160 is provided to correspond to each of at least two blocks where the plurality of electrode layers 1112, 1113, 1114, 1115, 1116, 1117, 1118 is grouped (a first block where the first electrode layer 1112 and the second electrode layer 1113 are grouped, a second block where the third electrode layer 1114 and the fourth electrode layer 1115 are grouped, a third block where the fifth electrode layer 1116 and the sixth electrode layer 1117 are grouped, and a fourth block where the seven electrode layer 1118 is grouped), so when controlling a specific memory cell, two wiring layers corresponding to a block including an electrode layer of the memory cell to control may be selected among the upper wiring layer 1120, the intermediate wiring layers 1130, 1140, 1150, and the lower wiring layer 1160 and used as each of the source electrode or the drain electrode. Hereinafter, the two wiring layers corresponding to a specific block means two wiring layers placing electrode layers included in the specific block between them and are adjacent the most closely.

For example, the upper wiring layer 1120 and the first intermediate wiring layer 1130 may be provided to correspond to the first block and used as the drain electrode or the source electrode for the first block, the first intermediate wiring layer 1130 and the second intermediate wiring layer 1140 may be provided to correspond to the second block and used as the drain electrode or the source electrode for the second block, the second intermediate wiring layer 1140 and the third intermediate layer 1150 may be provided to correspond to the third block and used as the drain electrode or the source electrode for the third block, and the third intermediate wiring layer 1150 and the lower wiring layer 1160 may be provided to correspond to the fourth block and used as the drain electrode or the source electrode for the fourth block.

As more detailed example, when controlling a memory cell corresponding to the first electrode layer 1112, the upper wiring layer 1120 and the first intermediate wiring layer 1130 corresponding to the first block (the block where the first electrode layer 1112 and the second electrode layer 1113 are grouped) are selected (the wiring layers placing the first electrode layer 1112 between them and adjacent the most closely), the upper wiring layer 1120 is used randomly as the source electrode, and the first intermediate layer 1130 may be used as the drain electrode among the source electrode or the drain electrode except the source electrode which the upper wiring layer 1120 is used as.

As another example, when controlling a memory cell corresponding to the third electrode layer 1114, the first intermediate wiring layer 1130 and the second intermediate wiring layer 1140 corresponding to the second block (the block where the third electrode layer 1114 and the fourth electrode layer 1115 are grouped) are selected (the wiring layers placing the third electrode layer 1114 between them and adjacent the most closely), the second intermediate wiring layer 1140 is used randomly as the drain electrode among the source electrode or the drain electrode, and the first intermediate layer 1130 may be used as the source electrode among the source electrode or the drain electrode except the drain electrode which the second intermediate wiring layer 1140 is used as.

Likewise, it has a reconfigurable feature that the first intermediate wiring layer 1130 is used as the drain electrode when another adjacent wiring layer 1120 placing a memory cell to control between them is used as the source electrode, and used as the source electrode when another adjacent wiring layer 1140 placing a memory cell to control between them is used as the drain electrode.

In the three dimensional flash memory element 1110 according to an example of embodiments of the present invention, as the first intermediate wiring layer 1130 as well as all of the other intermediate wiring layers 1140, 1150, the upper wiring layer 1120, and the lower wiring layer 1160 have a reconfigurable feature, each of the upper wiring layer 1120, the intermediate wiring layers 1130, 1140, 1150, and the lower wiring layer 1160 may be adaptively used as the rest one of the drain electrode or the source electrode except any one of them which another wiring layer is used as in response that another adjacent wiring layer placing a memory cell to control in between is used as the any one of the drain electrode or the source electrode.

However, it is not limited thereto, and it is regarded that the plurality of electrode layers 1112, 1113, 1114, 1115, 1116, 1117, 1118 is included in one block, and each of the upper wiring layer 1120, the intermediate wiring layers 1130, 1140, 1150, and the lower wiring layer 1160 may be adaptively used as the source electrode or the drain electrode.

Programming, erase, read operations of the three dimensional flash memory element 1110 having this structure will be described with referring to FIG. 12.

The above described three dimensional flash memory element 1100 may be implemented with various structures including the upper wiring layer 1120, the intermediate wiring layers 1130, 1140, 1150, and the lower wiring layer 1160. A detailed example thereof will be described with referring to FIGS. 13 to 16.

It is illustrated that the above described three dimensional flash memory element 1110 includes one string in the drawing, but it is not limited thereto, and a plurality of strings may be included. In this case, the plurality of strings may be connected to each of the upper wiring layer, the at least one intermediate wiring layer, and the lower wiring layer, and each of the upper wiring layer, the at least one intermediate wiring layer, and the lower wiring layer may be adaptively used as the source electrode or the drain electrode for a corresponding string. Likewise, a circuit diagram of the three dimensional flash memory element 1100 including the plurality of strings is as FIG. 11B.

Figure 12:
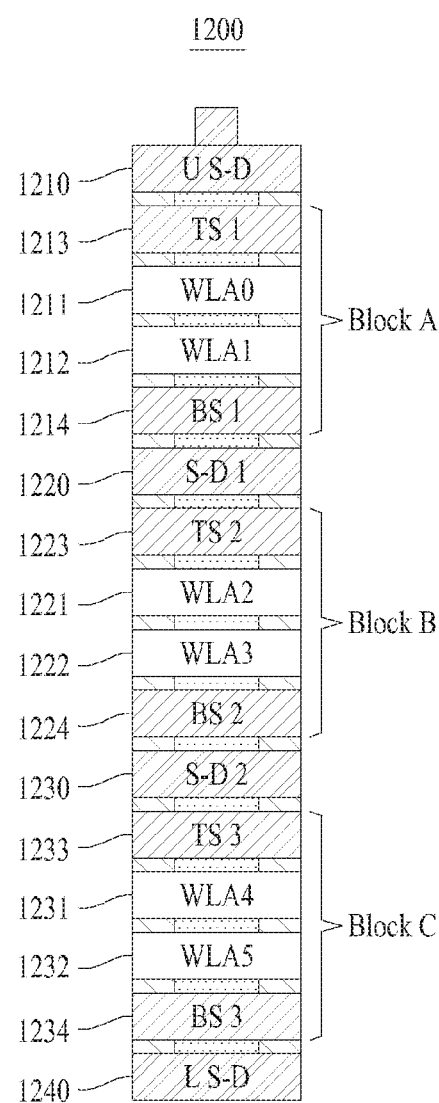
FIG. 12 is a drawing for describing an operation of three dimensional flash memory element according to an example embodiment of the present invention.

FIG. 12 a drawing for describing an operation of three dimensional flash memory element according to an example embodiment of the present invention.

Referring to FIG. 12, as described above in FIG. 11A, a three dimensional flash memory element 1200 includes a string including a channel layer extended in one direction and a plurality of electrode layers 1211, 1212, 1221, 1222, 1231, 1232 vertically layered for the channel layer, an upper wiring layer 1210 placed at the top of the string, intermediate wiring layers 1220, 1230 placed between the plurality of electrode layers in the intermediate area of the string, and a lower wiring layer 1240 placed at the bottom of the string. Here, the plurality of electrode layers 1211, 1212, 1221, 1222, 1231, 1232 may be divided by the intermediate wiring layers 1220, 1230, and grouped into three blocks (Block A including the first electrode layer 1211 and the second electrode layer 1212, Block B including the third electrode layer 1221 and the fourth electrode layer 1222, and Block C including the fifth electrode layer 1231 and the sixth electrode layer 1232).

Also, in the drawing, it is illustrated that the three dimensional flash memory element 1200 further includes an upper selector 1213 corresponding to the upper wiring layer 1210 and a lower selector 1214 corresponding to the first intermediate wiring layer 1220 on the Block A, further includes an upper selector 1223 corresponding to the first intermediate wiring layer 1220 and a lower selector 1224 corresponding to the second intermediate wiring layer 1230 on the Block B, and includes an upper selector 1233 corresponding to the second intermediate wiring layer 1230 and a lower selector 1234 corresponding to the lower wiring layer 1240 on the Block B, but it is not limited thereto, and each of selectors 1213, 1214, 1223, 1224, 1233, 1234 of Blocks may be omitted such as FIG. 11A.

Also, in the drawing, it is illustrated that in the three dimensional flash memory element 1200, the upper wiring layer 1210, the intermediate wiring layers 1220, 1230, and the lower wiring layer 1240 are not formed in a stepped form, but this is because the upper wiring layer 1210, the intermediate wiring layers 1220, 1230, and the lower wiring layer 1240 are extended in the depth direction or the height direction based on the drawing plane.

Hereinafter, the upper wiring layer 1210, the intermediate wiring layers 1220, 1230, and the lower wiring layer 1240 are mainly described for programming, erase, and read operations of the three dimensional flash memory element 1200.

First of all, regarding the programming operation, the three dimensional flash memory element 1200 may apply 0V voltage or low voltage compared to program voltage to each of the upper wiring layer 1210, the intermediate wiring layers 1220, 1230, and the lower wiring layer 1240 as below Table 1. At this point, the program voltage may be 18V as an example, and accordingly, the low voltage compared to the program voltage applied to each of the upper wiring layer 1210, the intermediate wiring layers 1220, 1230, and the lower wiring layer 1240 may be a value of supply voltage less than 18V.

The voltage is applied to each of the upper wiring layer 1210, the intermediate wiring layers 1220, 1230, and the lower wiring layer 1240, and simultaneously, the three dimensional flash memory element 1200 may perform a programming operation for a memory cell by applying program voltage $V_{prog}$ to a word line connected to the electrode layer 1222 corresponding to the memory cell to control as below Table 1. Here, the three dimensional flash memory element 1200 may apply turn on voltage $V_{pass}$ to a word line connected to the electrode layers 1211, 1212, 1221, 1231, 1232 corresponding to the rest memory cells except the memory cell to control in order that the rest memory cells do not interfere with the programming operation and simply maintain the On state. $V_{pass}$ may be 10V as an example.

TABLE 1

| | |
|---|---|
| Upper Source-Drain | 0 V |
| Top selector 1 | $V_{pass}$ |

TABLE 1-continued

| | |
|---|---|
| WLA0 | $V_{pass}$ |
| WLA1 | $V_{pass}$ |
| Bottom selector 1 | $V_{pass}$ |
| Middle Source-Drain 1 | 0 V |
| Top selector 2 | $V_{pass}$ |
| WLA2 | $V_{pass}$ |
| WLA3 | $V_{prog}$ |
| Bottom selector 2 | $V_{pass}$ |
| Middle Source-Drain 2 | 0 V |
| Top selector 3 | $V_{pass}$ |
| WLA4 | $V_{pass}$ |
| WLA5 | $V_{pass}$ |
| Bottom selector 3 | $V_{pass}$ |
| Low Source-Drain | 0 V |

Regarding an erase operation, the three dimensional flash memory element 1200 may apply erase voltage $V_{erase}$ to at least one wiring layer among the upper wiring layer 1210, the intermediate wiring layers 1220, 1230, and the lower wiring layer 1240 according to a memory cell to control. At this point, the erase voltage may be 14V as an example. For example, the three dimensional flash memory element 1200 may apply the erase voltage to any one wiring layer to be used as the drain electrode among the wiring layers above and below the block where an electrode layer corresponding to the memory cell to control is included. Also, as Table 2, when the erase voltage is applied to each of the upper wiring layer 1210, the intermediate wiring layers 1220, 1230, and the lower wiring layer 1240, all of memory cells included in the three dimensional flash memory element 1200 may be erased.

The erase voltage is applied to each of the upper wiring layer 1210, the intermediate wiring layers 1220, 1230, and the lower wiring layer 1240, and simultaneously, the three dimensional flash memory element 1200 may perform the erase operation for a corresponding memory cell by applying 0V or low voltage compared to the erase voltage to a word line connected to an electrode layer corresponding to the memory cell to control. At this point, the low voltage compared to the erase voltage may be a value of ground voltage less than 14V.

For example, as FIG. 2, when erasing all memory cells included in the three dimensional flash memory element 1200, the three dimensional flash memory element 1200 may perform the erase operation for all memory cells by applying 0V to each of the electrode layers 1211, 1212, 1221, 1222, 1231, 1232 corresponding to the memory cells.

TABLE 2

| | |
|---|---|
| Upper Source-Drain | $V_{erase}$ |
| Top selector 1 | 0 V |
| WLA0 | 0 V |
| WLA1 | 0 V |
| Bottom selector 1 | 0 V |
| Middle Source-Drain 1 | $V_{erase}$ |
| Top selector 2 | 0 V |
| WLA2 | 0 V |
| WLA3 | 0 V |
| Bottom selector 2 | 0 V |
| Middle Source-Drain 2 | $V_{erase}$ |
| Top selector 3 | 0 V |
| WLA4 | 0 V |
| WLA5 | 0 V |
| Bottom selector 3 | 0 V |
| Low Source-Drain | $V_{erase}$ |

Regarding the read operation, the three dimensional flash memory element 1200 may perform read operation for each of the at least two blocks where the plurality of electrode layers 1211, 1212, 1221, 1222, 1231, 1232 is grouped. For example, the three dimensional flash memory element 1200 may perform the read operation by performing sensing for the three blocks (Block A, B, and C) where the plurality of electrode layers 1211, 1212, 1221, 1222, 1231, 1232 is grouped in order as Table 3. This operation is as follows. First, the three dimensional flash memory element 1200 may select two wiring layers corresponding to the first block among the upper wiring layer 1210, the intermediate wiring layers 1220, 1230, and the lower wiring layer 1240 in the first block among the at least two blocks where the plurality of electrode layers 1211, 1212, 1221, 1222, 1231, 1232 is grouped. For example, the three dimensional flash memory element 1200 may select the upper wiring layer 1210 and the first intermediate wiring layer 1220 corresponding to Block A in order to sense Block A first among Blocks A, B, and C.

Then, the three dimensional flash memory element 1200 may apply a free charge voltage to any one wiring layer by using any one wiring layer among the two wiring layers as drain electrode. For example, as Table 3, the three dimensional flash memory element 1200 may apply the free charge voltage to the upper wiring layer 1210 by using the upper wiring layer 1210 as the drain electrode, and apply read voltage $V_{read}$ to a word line connected to an electrode layer corresponding to a memory cell to control. At this point, the turn on voltage $V_{pass}$ may be applied to a word line connected to an electrode layer corresponding to the rest memory cells except the memory cell to control in Block A in order that the rest memory cells do not interfere with the read operation and simply maintain the On state. $V_{pass}$ may be 4V as an example.

Accordingly, the three dimensional flash memory element 1200 may sense at least one memory cell corresponding to the at least one electrode layer included in the first block in order. For example, the three dimensional flash memory element 1200 may perform the read operation by sensing a memory cell corresponding to the first electrode layer 1211 and a memory cell corresponding to the second electrode layer 1212 included in Block A in order.

When the sensing for the first block is completed, the three dimensional flash memory element 1200 may select two wiring layers corresponding to the second block among the upper wiring layer 1210, the intermediate wiring layers 1220, 1230, and the lower wiring layer 1240 in the second block among the at least two blocks. As described above, when sensing Block B after sending Block A first, the three dimensional flash memory element 1200 may select the first intermediate wiring layer 1220 and the second wiring layer 1230 corresponding to Block B.

Then, the three dimensional flash memory element 1200 may apply a free charge voltage to any one wiring layer by using any one wiring layer among the two wiring layers as the drain electrode. For example, as Table 3, the three dimensional flash memory element 1200 may apply the free charge voltage to the first intermediate wiring layer 1220 by using the first intermediate wiring layer 1220 as the drain electrode, and apply read voltage $V_{read}$ to a word line connected to an electrode layer corresponding to a memory cell to control. At this point, the turn on voltage $V_{pass}$ may be applied to a word line connected to an electrode layer corresponding to the rest memory cells except the memory cell to control in Block B in order that the rest memory cells do not interfere with the read operation and simply maintain the On state. $V_{pass}$ may be 4V as an example.

Accordingly, the three dimensional flash memory element 1200 may sense at least one memory cell corresponding to the at least one electrode layer included in the second block in order. For example, the three dimensional flash memory element 1200 may perform the read operation by sensing a memory cell corresponding to the third electrode layer 1221 and a memory cell corresponding to the fourth electrode layer 1222 included in Block B in order.

Likewise, when the sensing for Block B is completed, the three dimensional flash memory element 1200 may perform sensing for Block C as Table 3.

At the point that the sensing for Block A is performed, the first intermediate layer 1220 is used as the source electrode, and because the first intermediate 1220 should be used as the drain electrode in order to perform free charge for Block B, the sensing for Block A and the free charge for Block B may not be simultaneously performed.

Accordingly, the three dimensional flash memory element 1200 may simultaneously perform the read operation by sensing a memory cell corresponding to the first electrode layer 1211 and a memory cell corresponding to the second electrode layer 1212 included in Block A in order and apply the free charge voltage by selecting two wiring layers (the second intermediate wiring layer 1230 and the lower wiring layer 1240) corresponding to Block C and using the second wiring layer 1230 as the drain electrode.

Likewise, according to the modified read operation, because the sensing for Block A and the free charge for Block B may be simultaneously performed, and similarly, the sensing for Block C and the free charge for Block B may

TABLE 3

| | Precharge | Sensing | 0 V | | | | |
|---|---|---|---|---|---|---|---|
| Upper Source-Drain | | | | | | | |
| Top selector 1 | Off(0 v) | On | Off(0 v) | | | | |
| WLA0 | $V_{pass}$ | $V_{pass}$ | Floating | | | | |
| WLA1 | $V_{read}$ | $V_{read}$ | Floating | | | | |
| Bottom selector 1 | Off(0 v) | On | Off(0 v) | | | | |
| Middle Source-Drain 1 | 0 V | 0 V | Precharge | Sensing | 0 V | | |
| Top selector 2 | Off(0 v) | Off(0 v) | Off(0 v) | On | Off(0 v) | | |
| WLA2 | Floating | Floating | $V_{pass}$ | $V_{pass}$ | Floating | | |
| WLA3 | Floating | Floating | $V_{read}$ | $V_{read}$ | Floating | | |
| Bottom selector 2 | Off(0 v) | Off(0 v) | Off(0 v) | On | Off(0 v) | | |
| Middle Source-Drain 2 | | | 0 V | 0 V | Precharge | Sensing | 0 V |
| Top selector 3 | | | | Off(0 v) | Off(0 v) | On | Off(0 v) |
| WLA4 | | | | Floating | $V_{pass}$ | $V_{pass}$ | Floating |
| WLA5 | | | | Floating | $V_{read}$ | $V_{read}$ | Floating |
| Bottom selector 3 | | | | Off(0 v) | Off(0 v) | On | Off(0 v) |
| Low Source-Drain | | | | 0 V | 0 V | 0 V | 0 V |

Accordingly, it is need to propose a modified read operation as below Table 4. The modified read operation is similar to the above described read operation, but it is feature to performing simultaneously the free charge for the second block (applying the free charge voltage to any one wiring layer in the second block) and the sensing for the first block (sensing the at least one memory cell corresponding to the at least one electrode layer included in the first block in order) when any one wiring layer applied the free charge voltage in the second block is not the rest one wiring layer among the two wiring layers of the first block except the any one wiring layer applied the free charge voltage in the first block. For example, as Table 4, when the first block to be sensed first is determined as Block A among Blocks A, B, and c, the upper wiring layer 1210 and the first intermediate wiring layer 1220 corresponding to Block A are selected, the upper wiring layer 1210 is used as the drain electrode, and the free charge voltage is applied to the upper wiring layer 1210, the three dimensional flash memory element 1200 may determine a block that a confirmed wiring layer (the first intermediate wiring layer 1220) is not used as the drain electrode among Blocks B and C as the next sensing subject after confirming the rest one wiring layer (the first intermediate wiring layer 1220 used as the source electrode) except the wiring layer (the wiring layer used as the drain electrode) applying the free charge voltage in Block A which is the first block to be performed sensing before the second block to be performed next sensing among Blocks A, B, and C is determined as any one of Blocks B or C. According to Table 4, because Block B uses the first intermediate wiring layer 1220 as the drain electrode, the three dimensional flash memory element 1200 may determine Block C as the next sensing subject.

be simultaneously performed, the three dimensional flash memory element 1200 may reduce the time required for the read operation.

TABLE 4

| | Pre charge | Sensing | 0 V | | |
|---|---|---|---|---|---|
| Upper Source-Drain | | | | | |
| Top selector 1 | Off(0 v) | On | Off(0 v) | | |
| WLA0 | $V_{pass}$ | $V_{pass}$ | Floating | | |
| WLA1 | $V_{read}$ | $V_{read}$ | Floating | | |
| Bottom selector 1 | Off(0 v) | On | Off(0 v) | | |
| Middle Source-Drain 1 | 0 V | 0 V | Pre charge | Sensing | 0 V |
| Top selector 2 | Off(0 v) | Off(0 v) | Off(0 v) | On | Off(0 v) |
| WLA2 | Floating | Floating | $V_{pass}$ | $V_{pass}$ | Floating |
| WLA3 | Floating | Floating | $V_{read}$ | $V_{read}$ | Floating |
| Bottom selector 2 | Off(0 v) | Off(0 v) | Off(0 v) | On | Off(0 v) |
| Middle Source-Drain 2 | | Pre charge | Sensing | 0 V | 0 V |
| Top selector 3 | Off(0 v) | Off(0 v) | On | Off(0 v) | |
| WLA4 | Floating | $V_{pass}$ | $V_{pass}$ | Floating | |
| WLA5 | Floating | $V_{read}$ | $V_{read}$ | Floating | |
| Bottom selector 3 | Off(0 v) | Off(0 v) | On | Off(0 v) | |
| Low Source-Drain | | 0 V | 0 V | 0 V | |

As described above, it is described for programming, erase, read operations when the three dimensional flash memory element 1200 includes the two intermediate wiring layers 1220, 1230, but the same operation may be also performed in case of including one intermediate wiring layer or three or more intermediate wiring layers.

FIGS. 13 to 16 are drawings representing examples of the three dimensional flash memory element illustrated in FIG. 11A. Hereinafter, the three dimensional flash memory element is based on the structure described with referring to FIGS. 6 and 11A, so the number of strings, and the number of at least one intermediate wiring layer for each of strings are not limited to the following examples, and it may be at least one.

Figure 13:
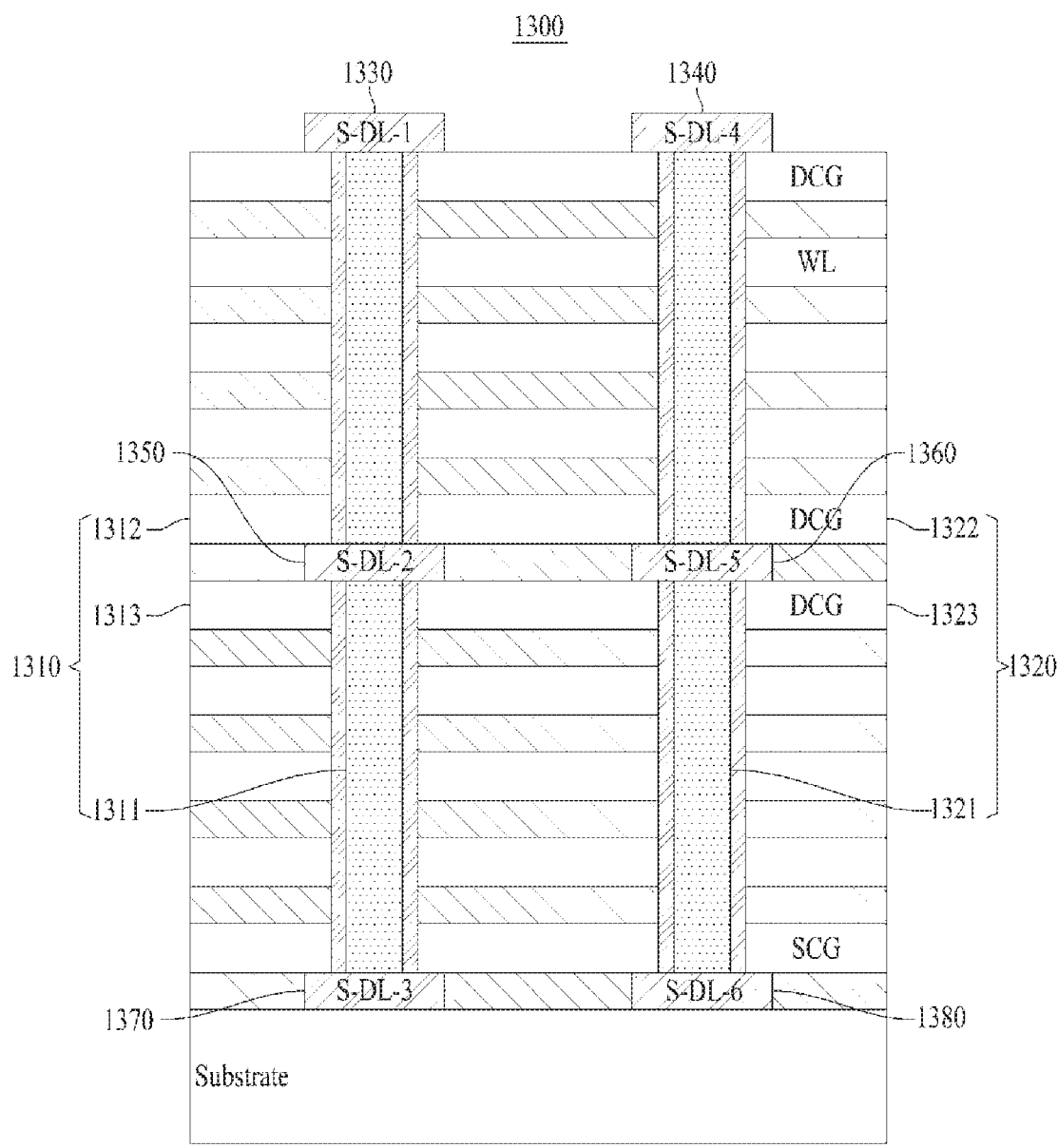
FIGS. 13 to 16 are drawings representing examples of the three dimensional flash memory element illustrated in FIG. 11A.

Referring to FIG. 13, a three dimensional flash memory element 1300 according to an example of embodiments of the present invention may include a first string 1310 and a second spring 1320, a first upper wiring layer 1330 and a second upper wiring layer 1340, a first intermediate wiring layer 1350 and a second intermediate wiring layer 1360, and a first lower wiring layer 1370 and a second wiring layer 1380.

More particularly, the first string 1310 may include a channel layer 1311 extended in one direction and a plurality of electrode layers 1312, 1313 vertically layered for the channel layer 1311, the first upper wiring layer 1330 may be formed at the top area of the first string 1310, the first intermediate wiring layer 1350 may be formed between the plurality of electrode layers 1312, 1313 which is the intermediate area, and the first lower wiring layer 1370 may be formed at the lower area. Likewise, the second sting 1320 may include a channel layer 1321 extended in one direction and a plurality of electrode layers 1322, 1323 vertically layered for the channel layer 1321, the second upper wiring layer 1340 may be formed at the top area of the second string 1320, the second intermediate wiring layer 1360 may be formed between the plurality of electrode layers 1322, 1323 which is the intermediate area, and the second lower wiring layer 1380 may be formed at the lower area. Here, a charge storage layer may be formed in each of the channel layers 1311, 1321.

At this point, the intermediate wiring layers 1350, 1360 may penetrate at least part of each of channel layers 1311, 1321. In other words, the first channel layer 1311 may be divided into top and bottom by the first intermediate wiring layer 1350, and the second channel layer 1321 also may be divided into top and bottom by the second wiring layer 1360.

For each of the strings 1310, 1320, the upper wiring layers 1330, 1340, the intermediate wiring layers 1350, 1360, and the lower wiring layers 1370, 1380 may be adaptively used as a drain electrode or a source electrode as described above, and may be provided to correspond to each of two blocks where the plurality of electrode layers 1312, 1313, 1322, 1323 is grouped. For example, in the first string 1312, the first upper wiring layer 1330 may be used as the drain electrode or the source electrode for a first block where the plurality of electrode layer 1312 is grouped, and the first intermediate wiring layer 1350 may be used as the drain electrode or the source electrode for a second block where the plurality of electrode layers 1313 is grouped. The first lower wiring layer 1370 may be used as the source electrode or the drain electrode for the second block where the plurality of electrode layers 1313 is grouped.

Likewise, in the second string 1320, the second upper wiring layer 1340 may be used as the drain electrode or the source electrode for a first block where the plurality of electrode layer 1322 is grouped, and the second intermediate wiring layer 1360 may be used as the drain electrode or the source electrode for a second block where the plurality of electrode layers 1323 is grouped. The second lower wiring layer 1380 may be used as the source electrode or the drain electrode for the second block where the plurality of electrode layers 1323 is grouped.

Here, at least one side of the lower side of each of the upper wiring layers 1330, 1340, the upper or lower side of each of the intermediate wiring layers 1350, 1360, the upper side of each of the lower wiring layers 1370, 1380 may be doped with at least one of N+ type or N− type. Hereinafter, the doping at least one side of the lower side of each of the upper wiring layers 1330, 1340, the upper or lower side of each of the intermediate wiring layers 1350, 1360, the upper side of each of the lower wiring layers 1370, 1380 with N+ type or N− type may mean that each side itself is doped with N+ type or N− type through N+ type or N− type ion implantation and annealing process for the channel layer directly contacting with the lower side of each of the upper wiring layers 1330, 1340, the upper or lower side of each of the intermediate wiring layers 1350, 1360, the upper side of each of the lower wiring layers 1370, 1380. However, it is not limited thereto, the doping at least one side of the lower side of each of the upper wiring layers 1330, 1340, the upper or lower side of each of the intermediate wiring layers 1350, 1360, the upper side of each of the lower wiring layers 1370, 1380 with N+ type or N− type may mean that N+ type doping layer or N− type doping layer is deposited on at least one side of the lower side of each of the upper wiring layers 1330, 1340, the upper or lower side of each of the intermediate wiring layers 1350, 1360, the upper side of each of the lower wiring layers 1370, 1380.

In the drawing, the first lower wiring layer 1370 and the second lower wiring layer 1380 are illustrated as independent components of each other in order to correspond to each of strings 1310, 1323, but it is not limited thereto, and the first lower wiring layer 1370 and the second wiring layer 1380 may be implemented as one components to be shared between the strings 1310, 1320 and be used in common by the strings 1310, 1320. A detailed description thereof will be described with referring to FIG. 15.

Figure 14:
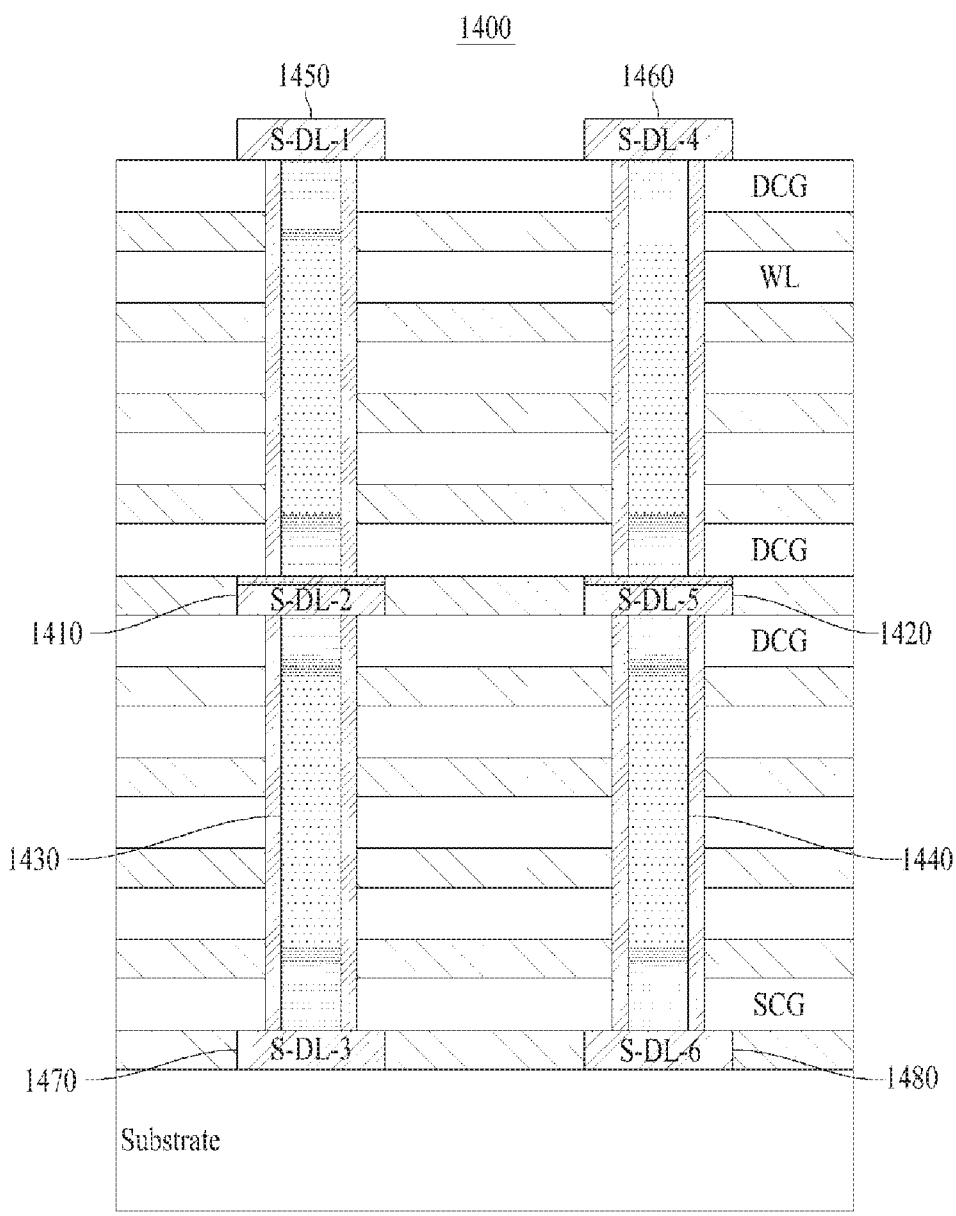

Referring to FIG. 14, all of the upper side and the lower side of intermediate wiring layers 1410, 1420 included in a three dimensional flash memory element 1400 may be doped with N+ type as the drawing. Therefore, channel resistance of an area adjacent to the intermediate wiring layers 1410, 1420 among channel layers 1430, 1440 of each of a plurality of strings may be reduced. However, it is not limited thereto, all of the upper side and the lower side of the intermediate wiring layers 1410, 1420 may be doped with N− type, only the upper side of the intermediate wiring layers 1410, 1420 may be doped with N+ type or N− type, or only the lower side of the intermediate wiring layers 1410, 1420 may be doped with N+ type or N− type. Of course, the upper side and the lower side of the intermediate wiring layers 1410, 1420 may not be doped.

Particularly, as described above, at least one side of the upper side and the lower side of the intermediate wiring layers 1410, 1420 may be doped through N+ type or N− type ion implantation and annealing process or N+ type or N− type doping layer may be deposited.

Also, the lower side of upper wiring layers 1450, 1460 included in the three dimensional flash memory element 1400 may be doped with N+ type. Accordingly, channel resistance of an area adjacent to the upper wiring layers 1450, 1460 among the channel layers 1430, 1440 of each of a plurality of strings may be reduced. Likewise, the lower side of the upper wiring layers 1450, 1460 may be doped with N− type or may not be dope at all.

Also, the upper side of lower wiring layers 1470, 1480 included in the three dimensional flash memory element 1400 may be doped with N+ type. Accordingly, channel resistance of an area adjacent to the lower wiring layers 1470, 1480 among the channel layers 1430, 1440 of each of a plurality of strings may be reduced. Likewise, the upper side of the lower wiring layers 1470, 1480 may be doped with N− type or may not be dope at all.

The lower side of the upper wiring layers 1450, 1460 and the upper side of the lower wiring layers 1470, 1480 also may be doped through N+ type or N− type ion implantation and annealing process or N+ type or N− type doping layer may be deposited.

Figure 15:
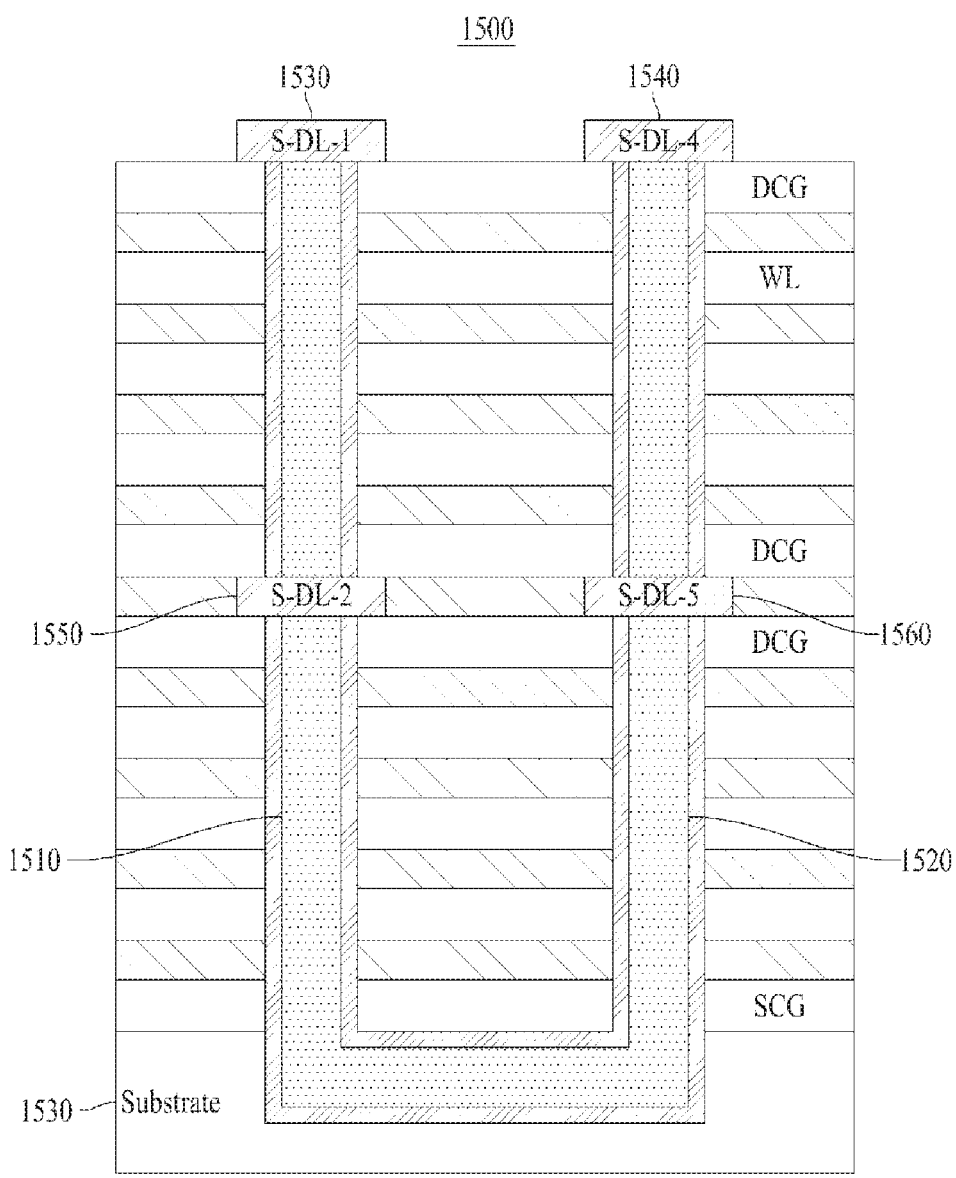

Referring to FIG. 15, a three dimensional flash memory element 1500 according to another example of embodiments of the present invention has a structure similar to the three dimensional flash memory element illustrated in FIG. 13, but it has a feature that a plurality of strings (more exactly, channel layers 1510, 1520 included in the plurality of strings) is connected each other through a substrate 1530. It is not illustrated in the drawing, but the three dimensional flash memory element 1500 having this structure may further include independent lower wiring layer or common lower wiring layer adaptively used as a source electrode or a drain electrode among electrode layers included in each of the plurality of strings. Here, the independent lower layer means a lower wiring layer connected to each of electrodes (SCG in the drawing) of the plurality of strings, and the common lower wiring layer means a lower wiring layer connected to electrode layers of the plurality of strings, shared each other between electrode layer (SCG in the drawing) of each of the plurality of strings, and used in common by electrode of each of the plurality of strings.

In the three dimensional flash memory element 1500 having this structure, at least one side of the lower side of each of upper wiring layers 1530, 1540 and the upper or lower side of intermediate wiring layers 1550, 1560 may be doped with any one of N+ type or N− type.

Figure 16:
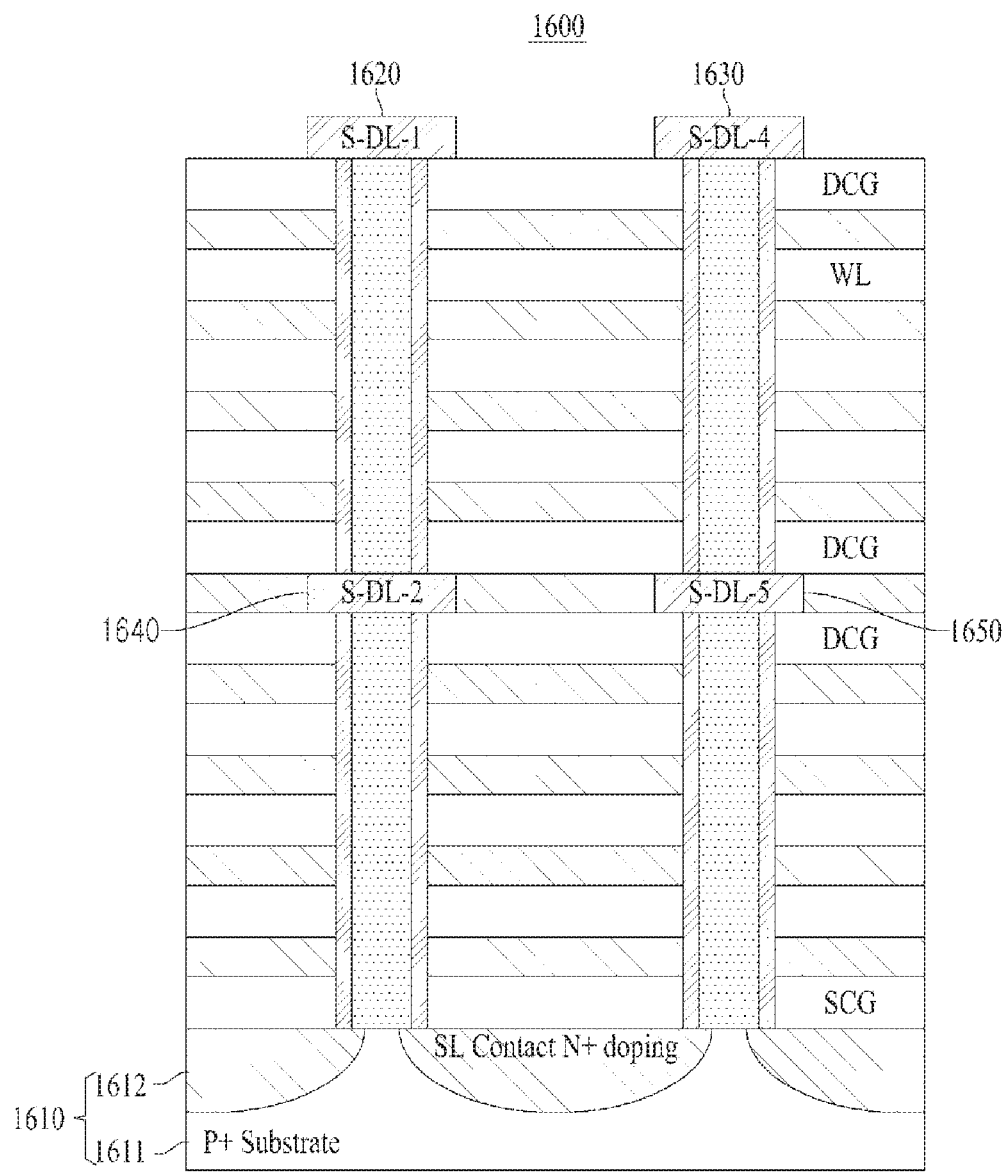

Referring to FIG. 16, a three dimensional flash memory element 1600 according to another example of embodiments of the present invention has a structure similar to the three dimensional flash memory element illustrated in FIG. 13, but it has a feature that a substrate 1610 serves as a lower wiring layer used as the source electrode or the drain electrode. More particularly, the substrate 1610 may be shared by at least two blocks where a plurality of electrode layers included in a plurality of strings is grouped by including a contact 1612 doped with N+ type on a P type substrate base 1611, and be adaptively used as the source electrode or the drain electrode.

Likewise, in the three dimensional flash memory element 1600 having this structure, at least one side of the lower side of each of upper wiring layers 1620, 1630 and the upper or lower side of intermediate wiring layers 1640, 1650 may be doped with any one of N+ type or N− type.

Figure 20:
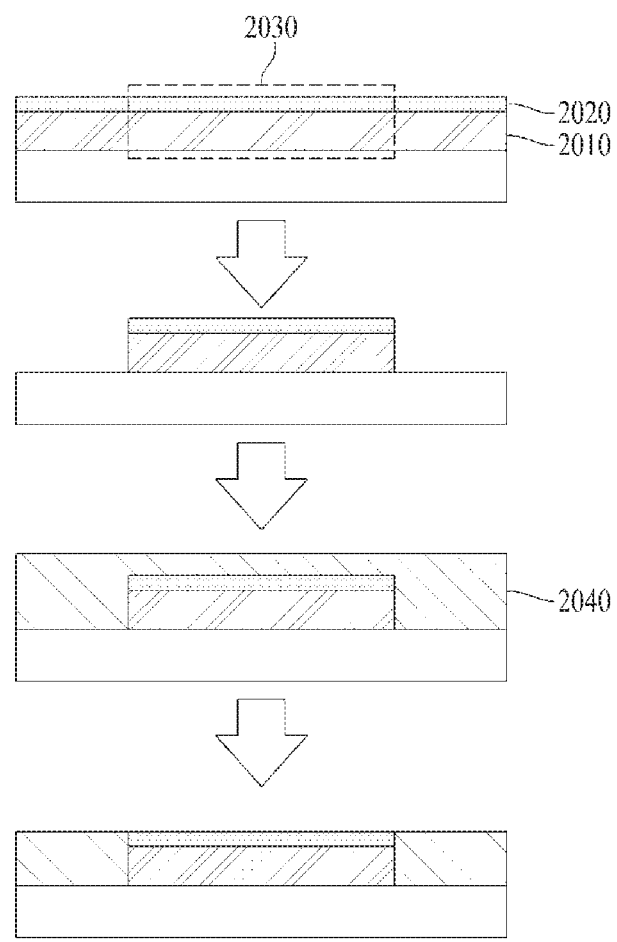
FIGS. 20 to 22 are drawings for describing detailed process of Step 1010 illustrated in FIG. 10.
Figure 21:
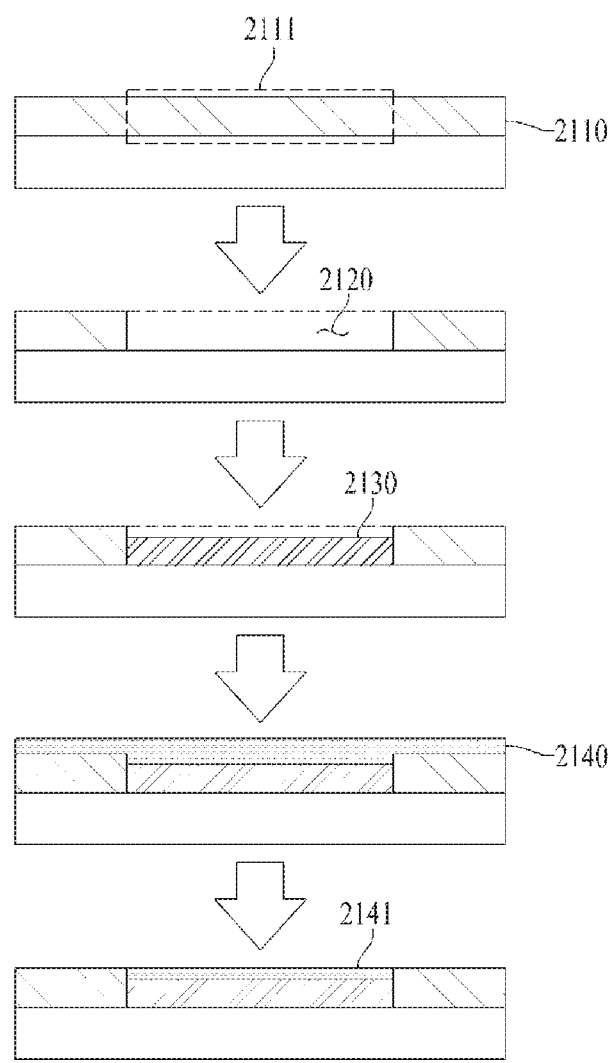
Figure 22:
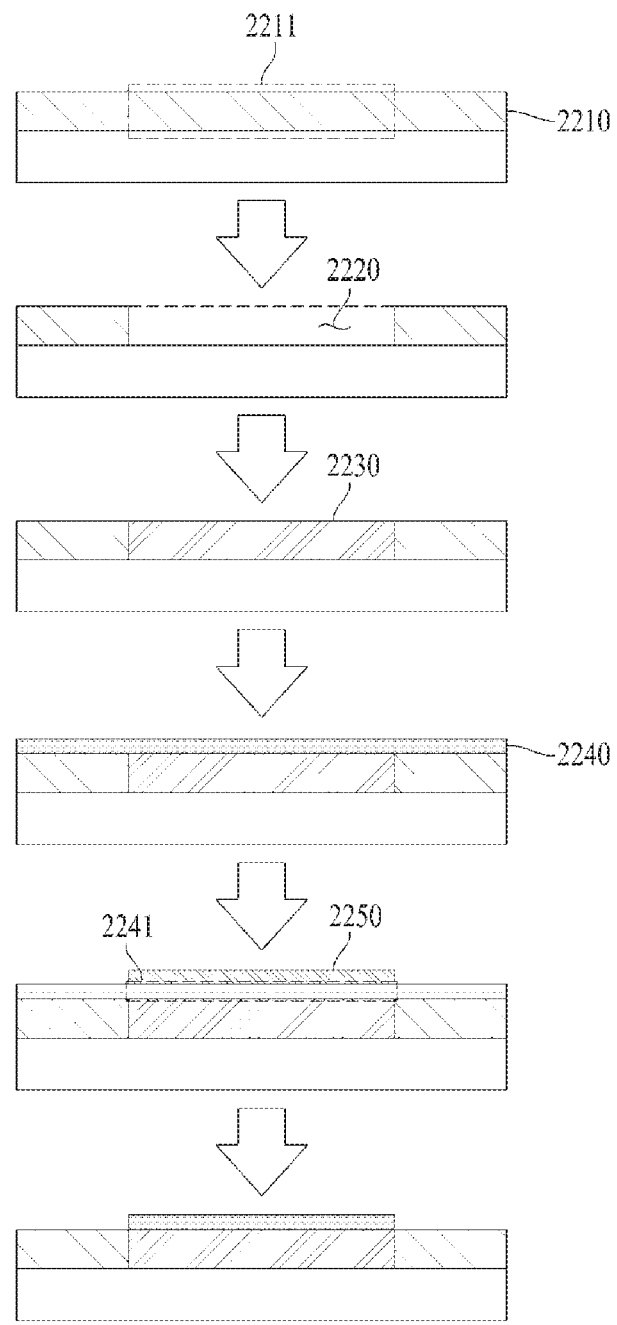

FIGS. 20 to 22 are drawings for describing detailed process of Step 1010 illustrated in FIG. 10.

A manufacturing system may perform selectively any one of the following detailed processes in preparing a intermediate mold structure where intermediate wiring layer is placed regarding Step 1010 illustrated in FIG. 10. In other words, the manufacturing system may selectively use a process as illustrated in below FIGS. 20 to 22 in forming the intermediate wiring layer in the intermediate mold structure. However, it is not limited thereto, and the manufacturing system may prepare the intermediate mold structure including the intermediate wiring layer formed by using various processes.

As an example of the detailed process for forming the intermediate wiring layer, referring to FIG. 20, the manufacturing system, first, may deposit a metal layer 2110 and N+ doping layer 2120 in order at the top of a layer base.

Then, the manufacturing system may etch the rest area of the area of the metal layer 2110 and the N+ type doping layer 2120 except a some area 2130 corresponding to an area where channel layer will be formed.

Next, the manufacturing system may form an interlayer insulating layer 2140 at the top of a layer base where the some area 2130 of the metal layer 2110 and the N+ type doping layer 2120 remains.

Afterward, the manufacturing system may form an intermediate wiring layer doped with N+ type at the upper side by performing CMP (Chemical Mechanical Polishing) for the interlayer insulating layer 2140 in order that the N+ doping layer 2120 is exposed.

In addition, it is not illustrated in the drawing, but the layer base may be erased as the intermediate wiring layer is formed.

The intermediate mold structure illustrated in FIGS. 18A and 18B may be prepared by filing the channel layer in a string hole and extending it after the plurality of electrode layers and the plurality of interlayer insulating layers are alternatively layered at the top of the intermediate wiring layer formed like this, and the string hold penetrating the plurality of electrode layers and the plurality of interlayer insulating layer is formed.

As another example of the detailed process forming the intermediate wiring layer, referring to FIG. 21, a manufacturing system, first, may generate an etching place 2120 by etching some area 2111 corresponding to an area where a channel layer will be formed among an area of an interlayer insulating layer 2110 layered at the top of a layer base.

Then, the manufacturing system may deposit the metal layer 2130 on the etching place 2120 in order to filing the etching place 2120 to a certain height. More particularly, the manufacturing system may perform etching to remain the metal layer 2130 to a certain height on the etching area 2120 after fully filling the etching place 2120 and depositing the metal layer 2130 to the top of the interlayer insulating layer 2110.

Afterward, the manufacturing system may deposit N+ type doping layer 2140 at the rest area of the area of the interlayer insulating layer 2110 except the area where the metal layer 2130 is deposited at the top of the metal layer 2130, and then, may form at least one intermediate wiring layer where N+ type is doped at the upper side by performing CMP for the N+ type doping layer 2140 in order to remain only an area 2141 corresponding to the top of the metal layer 2130 among the area of N+ type doping layer 2140.

In addition, it is not illustrated in the drawing, but the layer base may be erased as the intermediate wiring layer is formed.

After alternatively layering the plurality of electrode layers and the plurality of interlayer insulating layers at the top of the intermediate wiring layer formed like this, and forming a string hole penetrating the plurality of electrode layers and the plurality of interlayer insulating layers, by filing the channel layer in the string hole and extending it, the intermediate mold structure illustrated in FIGS. 18A and 18B may be prepared.

As another example of the detailed process forming at least one intermediate wiring layer, referring to FIG. 22, a manufacturing system, first, may generate an etching place 2220 by etching some area 2211 corresponding to the top of a string among an area of an interlayer insulating layer 2210 layered at the top of a layer base.

Then, the manufacturing system may deposit a metal layer 2230 in the etching place 2220 in order to fully filling the etching place 2220. More particularly, the manufacturing system may perform etching in order to remain the metal layer 2230 only in the etching place 2220 after fully filling the etching place 2220 and depositing the metal layer 2230 to the top of the interlayer insulating layer 2210.

Next, the manufacturing system may deposit an N+ type doping layer 2240 at the area of the interlayer insulating layer 2210 and the top of the metal layer 2230.

Afterward, the manufacturing system may form at least one intermediate wiring layer where N+ type is doped on the upper side by placing and etching a mask 2250 on an area 2241 corresponding to the top of the metal layer 2230 among the area of the N+ type doping layer 2240 in order to remain only the area 2241 corresponding to the top of the metal layer 2230 among the area of the N+ type doping layer 2240.

In addition, it is not illustrated in the drawing, but the layer base may be erased as the intermediate wiring layer is formed.

After alternatively layering the plurality of electrode layers and the plurality of interlayer insulating layers at the top of the intermediate wiring layer formed like this, and forming a string hole penetrating the plurality of electrode layers and the plurality of interlayer insulating layers, by filing the channel layer in the string hole and extending it, the intermediate mold structure illustrated in FIGS. 18A and 18B may be prepared.

As described above, it is described the process for forming at least one intermediate wiring layer where N+ type is dope on the upper side, but the cases that N− type is doped, both of the upper side and the lower side is doped with N+ type or N− type, and there is no doping on both of the upper side and the lower side may be manufactured through the similar process.

Although the embodiments of the present invention are described in detail above, claims of the present invention are not limited thereto, and various modifications and variations of those skilled in the art using the basic concept of the present invention defined in the following claims are included in claims of the present invention.

The invention claimed is:

1. A three dimensional flash memory element comprising:
a string including a channel layer extending in a vertical direction and penetrating a plurality of vertically layered electrode layers;
an upper wiring layer at the top of the string;
at least one intermediate wiring layer between the plurality of vertically layered electrode layers in an intermediate area of the string; and
a lower wiring layer at the bottom of the string,
wherein each of the upper wiring layer, the at least one intermediate wiring layer, and the lower wiring layer is configured to be adaptively used as any one of a drain electrode or a source electrode, and
wherein the plurality of electrode layers extend in a first direction, the first direction orthogonal to the vertical direction.

2. The three dimensional flash memory element of claim 1, wherein each of the upper wiring layer, the at least one intermediate wiring layer, and the lower wiring layer extend in a second direction, the second direction orthogonal to the first direction.

3. The three dimensional flash memory element of claim 2, wherein the upper wiring layer, the at least one intermediate wiring layer, and the lower wiring layer are in a stepped form in order that the extended lengths of the upper wiring layer, the at least one intermediate wiring layer, and the lower wiring layer are different from each other.

4. A three dimensional flash memory element comprising:
a string including a channel layer extending in a vertical direction and penetrating a plurality of vertically layered electrode layers, the plurality of vertically layered electrode layers extending in a first direction;
an upper wiring layer at the top of the string;
at least one intermediate wiring layer between the plurality of electrode layers in an intermediate area of the string; and
a lower wiring layer at the bottom of the string,
wherein each of the upper wiring layer, the at least one intermediate layer, and the lower wiring layer is extended in a second direction, the second direction orthogonal to the first direction, and
wherein the upper wiring layer, the at least one intermediate layer, and the lower wiring layer are formed in a stepped form in order that the extended lengths of the upper wiring layer, the at least one intermediate wiring layer, and the lower wiring layer are different from each other.

5. The three dimensional flash memory element of claim 4, wherein each of the upper wiring layer, the at least one intermediate wiring layer, and the lower wiring layer is configured to be adaptively used as any one of a drain electrode or a source electrode.

6. The three dimensional flash memory element of claim 1, wherein each of the upper wiring layer, the at least one intermediate wiring layer, and the lower wiring layer is configured to be adaptively used as the remainder one of the drain electrode or the source electrode in response to another wiring layer being used as one of the drain electrode or the source electrode in a memory cell to be controlled.

7. The three dimensional flash memory element of claim 6, wherein when to control the memory cell located between the upper wiring layer and the at least one intermediate wiring layer, the upper wiring layer is used as randomly any one of the drain electrode or the source electrode, and the at least one intermediate wiring layer is used as the remaining one of the drain electrode or the source electrode, and when to control the memory cell located between the at least one intermediate wiring layer and the lower wiring layer, the at least one intermediate wiring layer is used as randomly any one of the drain electrode or the source electrode, and the lower wiring layer is used as the remaining one of the drain electrode or the source electrode.

8. The three dimensional flash memory element of claim 1, wherein the upper wiring layer and the at least one intermediate wiring layer are configured to respond to each of at least two blocks where the plurality of vertically layered electrode layers is grouped.

9. The three dimensional flash memory element of claim 1, wherein the channel layer is at least partially penetrated by the at least one intermediate wiring layer.

10. The three dimensional flash memory element of claim 1, wherein at least one side of the upper side or lower side of the at least one intermediate wiring layer, the lower side of the upper wiring layer, or the upper side of the lower wiring layer is doped with at least one of N+ type or N− type.

11. The three dimensional flash memory element of claim 1, wherein the string is one of a plurality of strings, and the plurality of strings are connected to each other through a substrate.

12. The three dimensional flash memory element of claim 11, wherein the plurality of strings share and use in common the lower wiring layers.

13. The three dimensional flash memory element of claim 1, wherein the lower wiring layer is included in a P type substrate base, and the lower wiring layer include a N+ type doped contact.

14. A manufacturing method of three dimensional flash memory element comprising:
preparing a plurality of mold structures, in which each of at least one strings including a plurality of electrode layers and a plurality of interlayer insulating layers alternately layered and a channel layer extended in one direction to penetrate the plurality of electrode layers and the plurality of interlayer insulating layers is formed,
layering at least one remaining mold structure on an intermediate wiring layer at the top of any one mold structure where a lower wiring layer is placed at the bottom of the at least one string; and
forming an upper wiring layer at the top of the at least one string on the at least one remaining mold structure layered on the any one mold structure,
wherein each of the upper wiring layer, the intermediate wiring layer, and the lower wiring layer is adaptively used as any one of a drain electrode or a source electrode.

15. The manufacturing method of three dimensional flash memory element of claim 14 further comprising doping at least one side of the upper side, lower side of the intermediate wiring layer, the lower side of the upper wiring layer, or the upper side of the lower wiring layer placed at the bottom of the at least one string with at least one of N+ type or N− type.

16. The manufacturing method of three dimensional flash memory element of claim 15, wherein the doping at least one side with at least one of N+ type or N− type comprises doping the at least one side with at least one of N+ type or N− type by using N+ or N− ion implantation and annealing process through an upper channel layer of the at least one string.

17. The manufacturing method of three dimensional flash memory element of claim 14, wherein the preparing a plurality of mold structures comprises:
depositing a metal layer and an N+ type doping layer, in order, at the top of a layer base;
etching the remaining area of the metal layer and the N+ type doping layer except some area corresponding to where the channel layer of the at least one remaining mold structure will be formed;
forming an interlayer insulating layer at the top of the layer base where some area of the metal layer and the N+ type doping layer remains; and
performing CMP (Chemical Mechanical Polishing) for the interlayer insulating layer in order that the N+ type doping layer is exposed.

18. The manufacturing method of three dimensional flash memory element of claim 14, wherein the preparing the plurality of mold structures comprises:
generating an etching space by etching some area corresponding to an area where the channel layer of the at least one remaining mold structure will be formed in an interlayer insulating layer among the plurality of interlayer insulating layers;
depositing a metal layer in the etching space in order that the etching space is filled up to certain height;
depositing an N+ type doping layer in the remaining area of the interlayer insulating layer except the area where the metal layer is deposited and at the top of the metal layer; and
performing CMP for the N+ type doping layer in order to remain only the area corresponding to the top of the metal layer among the N+ type doping layer.

19. The manufacturing method of three dimensional flash memory element of claim 14, wherein the preparing the plurality of mold structures comprises:
generating an etching space by etching some area corresponding to an area where a channel area of the at least one remaining mold structure will be formed in an interlayer insulating layer among the plurality of the interlayer insulating layers;
depositing a metal layer in the etching space in order to fill up the etching space;
depositing a N+ type doping layer in the area of the interlayer insulating layer and at the top of the metal layer; and
placing and etching a mask at the area corresponding to the top of the metal layer among the N+ type doping layer in order to remain only the area corresponding to the top of the metal layer among the N+ type doping layer.

20. The manufacturing method of three dimensional flash memory element of claim 14, wherein the layering the at least one remaining mold structure includes layering the at least one remaining mold structure at the top a mold structure such that the location of the string on the at least one mold structure and the location of the string on the at least one remaining mold structure match.

21. The manufacturing method of three dimensional flash memory element of claim 14, wherein the lower wiring layer is extended in a direction orthogonal to a direction where the plurality of electrode layers is extended on the at least one mold structure,
the intermediate wiring layer is extended in a direction orthogonal to a direction where the plurality of electrode layers is extended on the at least one remaining mold structure,
the forming the upper wiring layer at the top of the string on the at least one remaining mold structure is extending the upper wiring layer in a direction orthogonal to a direction where the plurality of electrode layers is extended on the at least one remaining mold structure, and
the upper wiring layer, the intermediate wiring layer, and the lower wiring layer are formed in a stepped form in order that the extended lengths of the upper wiring layer, the at least one intermediate wiring layer, and the lower wiring layer are different from each other.

* * * * *